(12) United States Patent
Driscoll et al.

(10) Patent No.: US 9,927,505 B2
(45) Date of Patent: Mar. 27, 2018

(54) ARTIFICIALLY STRUCTURED UNIT CELLS PROVIDING LOCALIZED $B_1$ MAGNETIC FIELDS FOR MRI AND NMR DEVICES

(71) Applicant: Elwha LLC, Bellevue, WA (US)

(72) Inventors: Tom Driscoll, San Diego, CA (US); David R. Smith, Durham, NC (US); Yaroslav A. Urzhumov, Bellevue, WA (US)

(73) Assignee: Elwha LLC

( * ) Notice: Subject to any disclaimer, the term of this patent is extended or adjusted under 35 U.S.C. 154(b) by 897 days.

(21) Appl. No.: 14/334,398

(22) Filed: Jul. 17, 2014

(65) Prior Publication Data

US 2016/0018494 A1   Jan. 21, 2016

(51) Int. Cl.
| | | |
|---|---|---|
| G01R 33/36 | (2006.01) | |
| G01R 33/3415 | (2006.01) | |
| G01R 33/34 | (2006.01) | |
| G01R 33/345 | (2006.01) | |

(52) U.S. Cl.
CPC ............ *G01R 33/36* (2013.01); *G01R 33/345* (2013.01); *G01R 33/3415* (2013.01); *G01R 33/34046* (2013.01); *G01R 33/3607* (2013.01); *G01R 33/3614* (2013.01); *G01R 33/3621* (2013.01)

(58) Field of Classification Search
CPC .............. G01R 33/36; G01R 33/3415; G01R 33/34046; G01R 33/345; G01R 33/3607; G01R 33/3614; G01R 33/3621
See application file for complete search history.

(56) References Cited

U.S. PATENT DOCUMENTS

| | | |
|---|---|---|
| 4,717,881 A | 1/1988 | Flugan |
| 4,837,515 A | 6/1989 | Nishihara et al. |
| 5,206,592 A | 4/1993 | Buess et al. |
| 5,236,039 A | 8/1993 | Edelstein et al. |
| 5,435,302 A | 7/1995 | Lenkinski et al. |
| 5,548,218 A | 8/1996 | Lu |

(Continued)

OTHER PUBLICATIONS

Brown et al.; "Chapter 14: Instrumentation"; MRI: Basic Principles and Applications, $3^{rd}$ Edition; Bearing a date of 2003, created on Jul. 17, 2014; pp. 197-211.

(Continued)

*Primary Examiner* — Rodney Bonnette

(57) ABSTRACT

Described embodiments include a system, apparatus, and method. An apparatus includes an array of at least two groups of at least two artificially structured electromagnetic unit cells. Each group of the at least two groups configured to be respectively linearly arranged with respect to the z-axis of the bore of MRI or NMR device. Each group of the at least two groups of artificially structured electromagnetic unit cells configured to transform an incident pulse of radiofrequency electromagnetic waves into a pulse of radiofrequency magnetic field $B_1$ orientated transverse to a segment of the z-axis and spatially proximate to the group. The apparatus includes a radiofrequency electromagnetic wave conducting structure configured to selectably distribute a received pulse of radiofrequency electromagnetic waves to a group of the at least two groups.

44 Claims, 15 Drawing Sheets

(56) References Cited

U.S. PATENT DOCUMENTS

| | | | |
|---|---|---|---|
| 5,682,893 | A | 11/1997 | Meyer et al. |
| 5,914,599 | A | 6/1999 | Sharp |
| 6,049,206 | A | 4/2000 | Sharp |
| 6,118,274 | A | 9/2000 | Roffmann et al. |
| 6,344,745 | B1 | 2/2002 | Reisker et al. |
| 6,356,081 | B1 | 3/2002 | Misic |
| 7,227,360 | B2 | 6/2007 | Jevtic et al. |
| 2008/0246477 | A1* | 10/2008 | Nakabayashi ... G01R 33/34046 324/312 |
| 2012/0280688 | A1 | 11/2012 | Hullihen, III |
| 2013/0021033 | A1* | 1/2013 | Stoeckel ............ A61B 5/055 324/318 |
| 2016/0018491 | A1* | 1/2016 | Driscoll ........... G01R 33/34046 324/309 |
| 2016/0018492 | A1* | 1/2016 | Driscoll ............ G01R 33/3607 324/322 |
| 2016/0018495 | A1* | 1/2016 | Driscoll ............ G01R 33/36 324/309 |

OTHER PUBLICATIONS

Collins et al.; "Calculation of Radiofrequency Electromagnetic Fields and Their Effects in MRI of Human Subject"; Magn. Reson. Med.; Bearing a date of May 2011; pp. 1470-1482; vol. 65, No. 5.
Driesel et al.; "A Four-Channel Transceive Phased-Array Helmet Coil for 3 T"; Max Planck Institute; Created on Apr. 9, 2014; p. 1.
Freire et al.; "Experimental demonstration of a µ = -1 metamaterial lens for magnetic resonance imaging"; Applied Physics Letters; Bearing a date of Dec. 9, 2008; pp. 231108-1 to 231108-3; vol. 93; American Institute of Physics.
"Gradient Coils"; ReviseMRI.com; Created on Jul. 17, 2014; p. 1; located at: www.revisemri.com/tools/system/gradientcoils; Printed on Mar. 26, 2014.
Hornak, J.P.; "Chapter 6: Imaging Principles"; The Basics of MRI; Bearing a date of Sep. 1, 1996; pp. 1-4.
Hornak, J.P.; "Chapter 9: Imaging Hardware"; The Basics of MRI; Bearing a date of Sep. 1, 1996; pp. 1-12.
Katscher et al.; "Parallel Magnetic Resonance Imaging"; Neurotherapeutics: the Journal of the American Society for Experimental NeuroTherapeutics; Bearing a date of Jul. 2007; pp. 499-510; vol. 4, No. 3.
Kumar et al.; "Optimized Quadrature Surface Coil Designs"; MAGMA; Bearing a date of Mar. 2008; pp. 41-52; vol. 21, No. 1-2.
Lipworth et al.; "Magnetic Metamaterial Superlens for Increased Range Wireless Power Transfer"; Scientific Reports; Bearing a date of Jan. 10, 2014; pp. 1-6; vol. 4, No. 3642.
Mclean et al.; "Interpreting Antenna Performance Parameters for EMC Applications: Part 2: Radiation Pattern, Gain, and Directivity"; TDK RF Solutions, Inc.; Created on Apr. 9, 2014; pp. 7-17.
"Physics of Magnetic Resonance Imaging"; Wikipedia; Bearing a date of Apr. 21, 2014; pp. 1-13.
"Radiofrequency Coil"; Wikipedia; Bearing a date of Apr. 12, 2014; pp. 1-2.
Raymond, Eileen; "Radio Frequency inhomogeneity Compensation Technology"; National Research Council Canada; Bearing a date of Jul. 22, 2013; p. 1; located at: www.nrc- cnrc.gc.ca/eng/solutions/licensing/rf_inhomogeneity_compensation_technology_html.
"RF Receiver Coils"; ReviseMRI.com; Created on Jul. 17, 2014; pp. 1-3; located at: www.revisemri.com/tools/system/rfcoils; Printed on Mar. 26, 2014.
Westbrook, Catherine; "Part 9: Instrumentation" MRI at a Glance; Bearing a date of 2002, Created on Jul. 17, 2014; pp. 90-96.
Wright et al.; "Coil Arrays for Parallel MRI: Introduction and Overview"; Latsis Symposium 2004: Second Intl. Workshop on Parallel MRI, Zurich; Bearing dates of Oct. 15-17, 2004; pp. 1-2.
Yuan et al.; "Zero loss magnetic metamaterials using powered active unit cells"; Optics Express; Bearing a date of Aug. 31, 2009; pp. 16135-16143; vol. 17, No. 18.
Zhou, Anqi; "RF Coils in MRI"; Created on Apr. 9, 2014, pp. 1-33.
PCT International Search Report; International App. No. PCT/US2015/040702; Oct. 22, 2015; pp. 1-3.

* cited by examiner

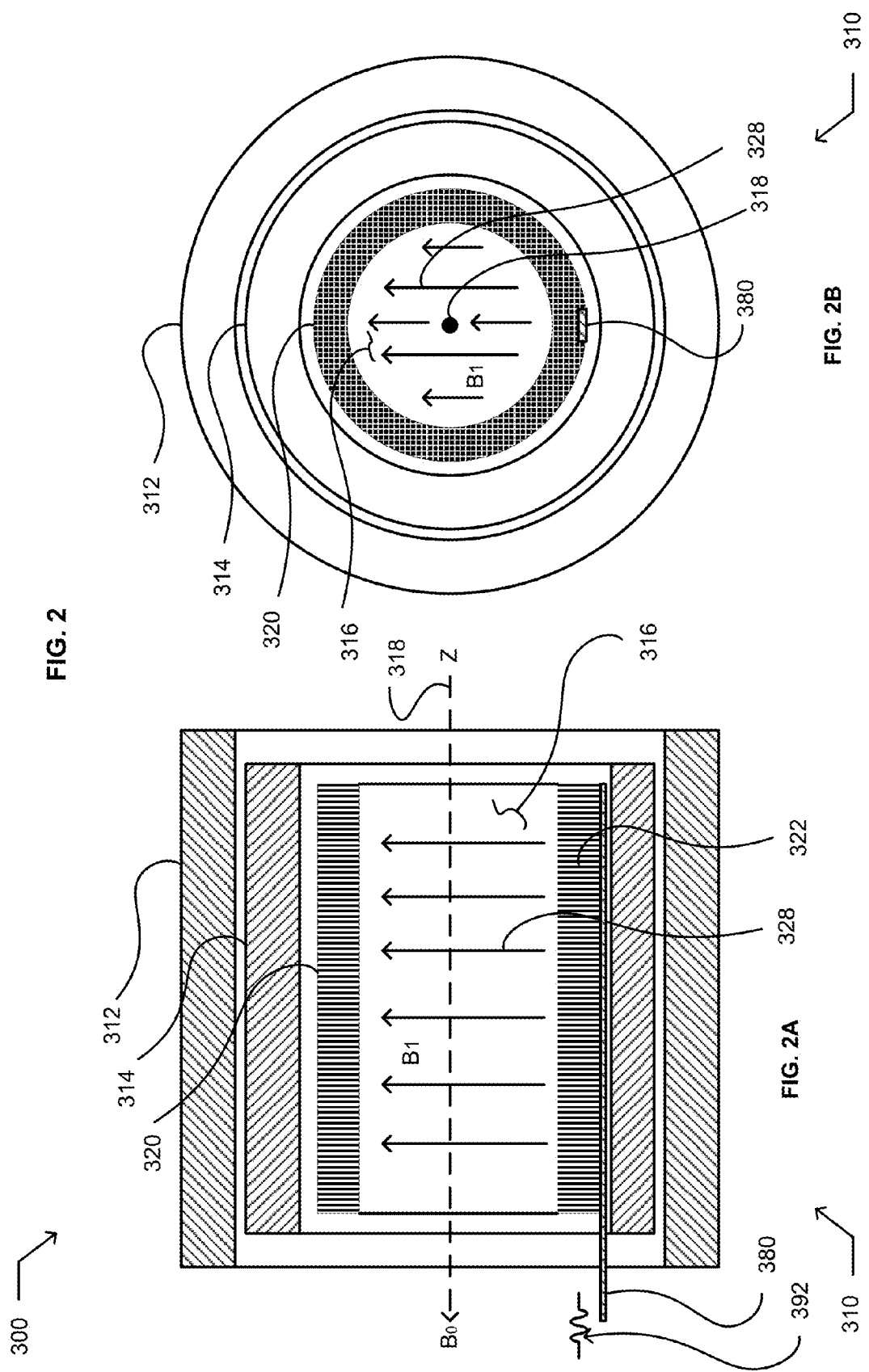

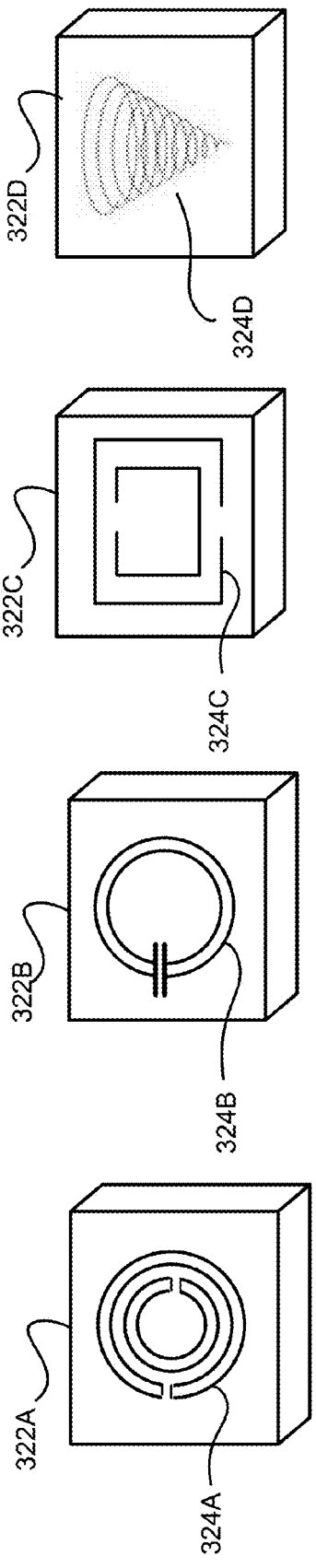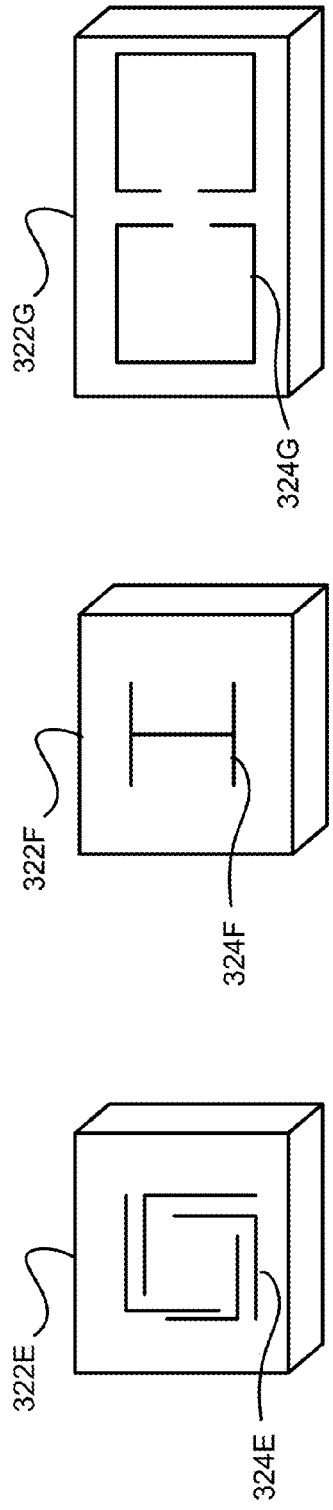

510 Means for receiving a pulse of radiofrequency electromagnetic waves from a radiofrequency signal generator or synthesizer component of a magnetic resonant imaging or a nuclear magnetic resonant device.

520 Means for distributing the received pulse of radiofrequency electromagnetic waves as an incident pulse of radiofrequency electromagnetic waves to an artificially structured means for transforming radiofrequency electromagnetic waves.

530 Artificially structured means for transforming the incident pulse of radiofrequency electromagnetic waves into a pulse of a radiofrequency magnetic field $B_1$ orientated transverse to the quasistatic magnetic field $B_0$ parallel to the z-axis of a bore of the magnetic resonant imaging or the nuclear magnetic resonant device, the pulse of the radiofrequency magnetic field $B_1$ having a magnetic field intensity sufficient to excite a detectable magnetic resonance in magnetically active nuclei located within at least a portion of an examination region located within the bore.

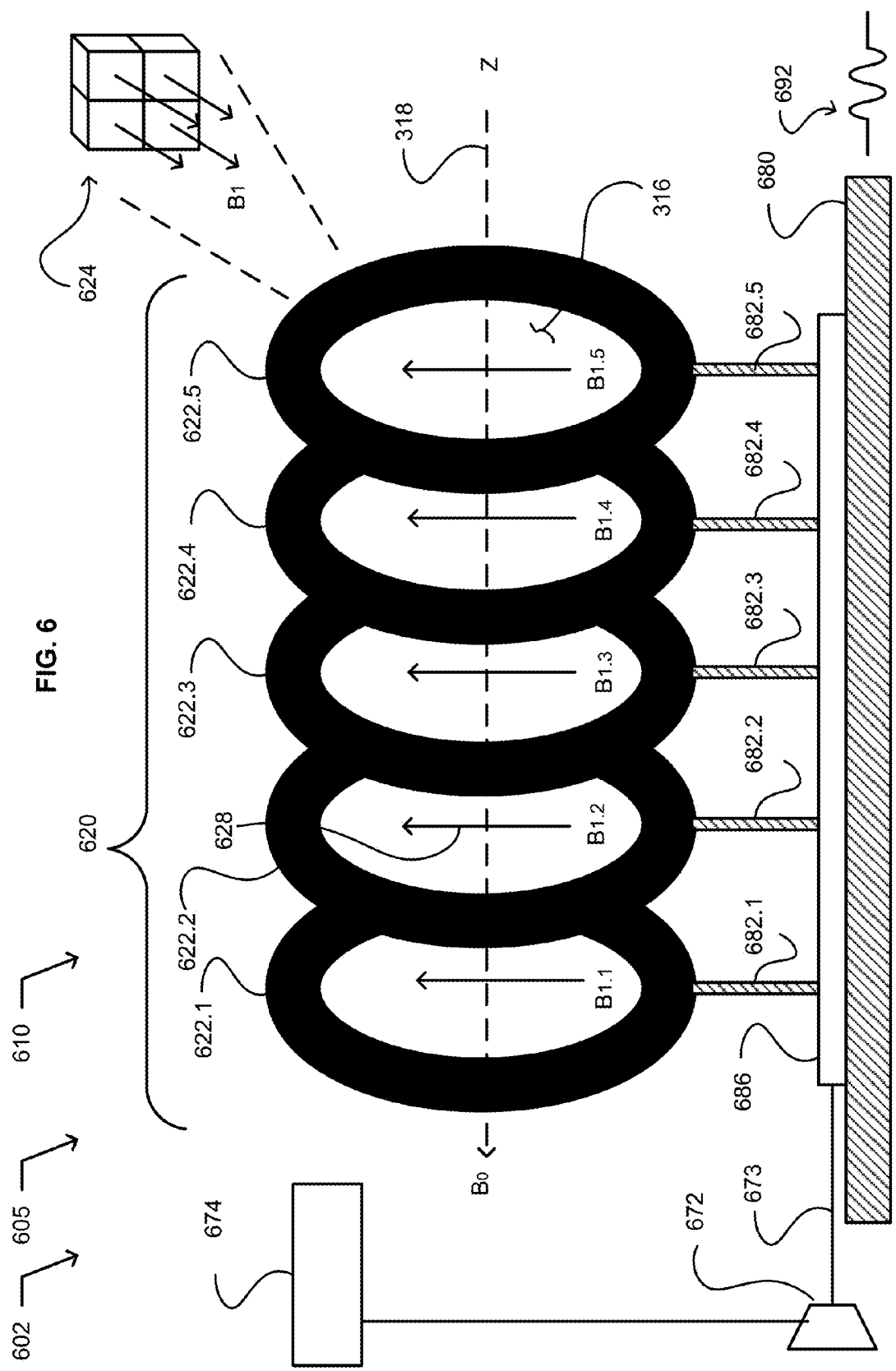

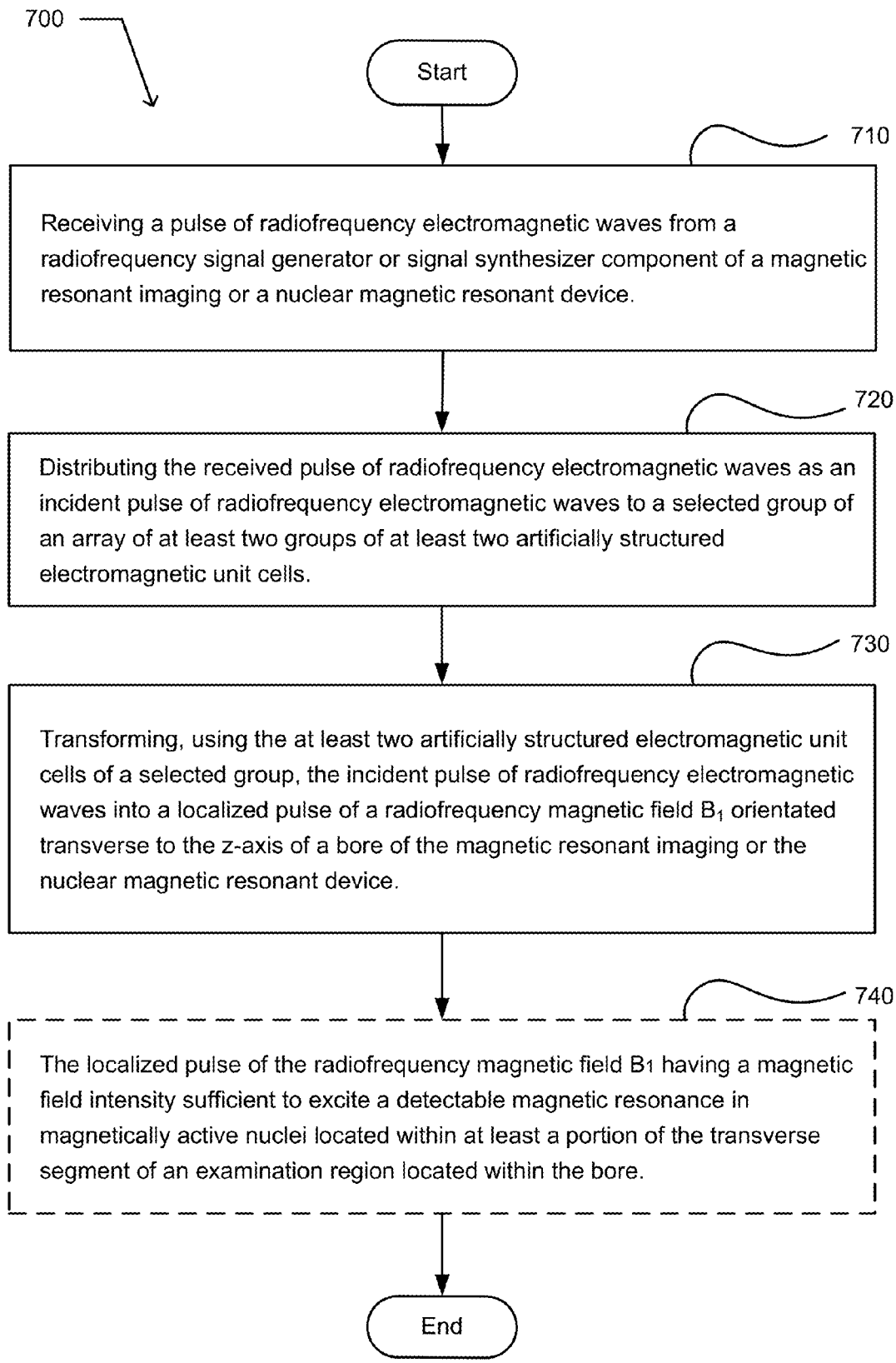

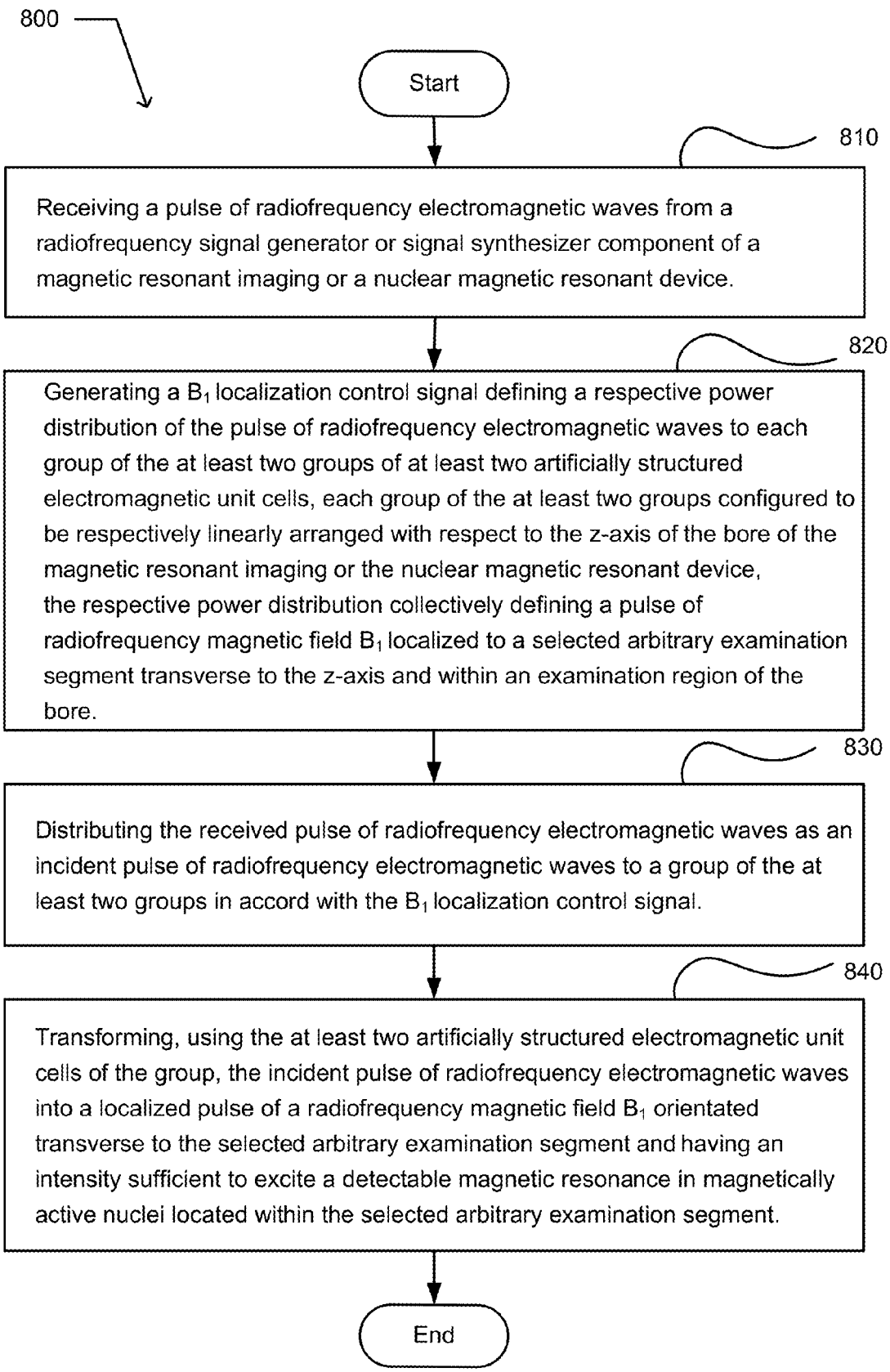

FIG. 10

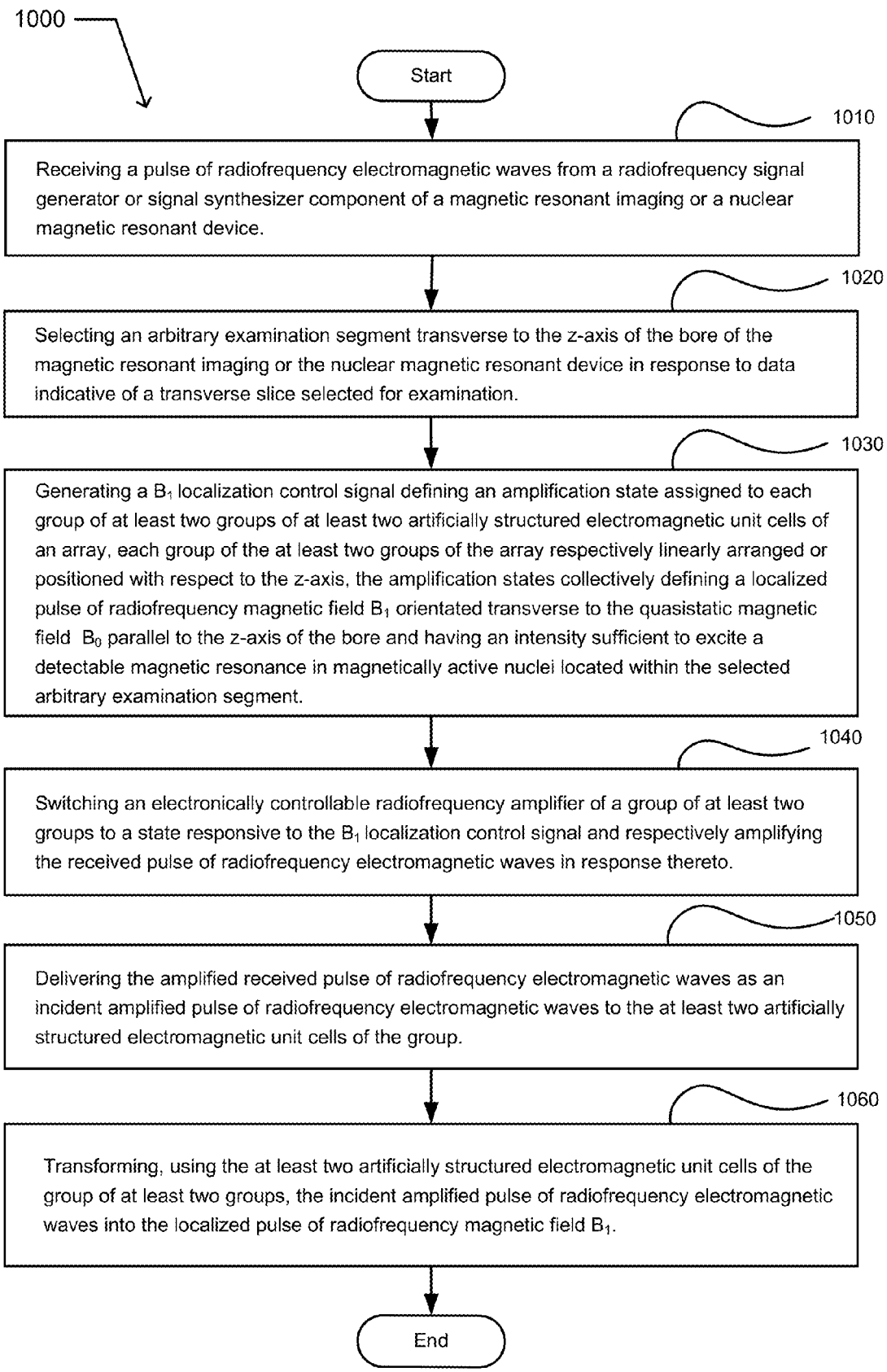

1000

Start

1010
Receiving a pulse of radiofrequency electromagnetic waves from a radiofrequency signal generator or signal synthesizer component of a magnetic resonant imaging or a nuclear magnetic resonant device.

1020
Selecting an arbitrary examination segment transverse to the z-axis of the bore of the magnetic resonant imaging or the nuclear magnetic resonant device in response to data indicative of a transverse slice selected for examination.

1030
Generating a $B_1$ localization control signal defining an amplification state assigned to each group of at least two groups of at least two artificially structured electromagnetic unit cells of an array, each group of the at least two groups of the array respectively linearly arranged or positioned with respect to the z-axis, the amplification states collectively defining a localized pulse of radiofrequency magnetic field $B_1$ orientated transverse to the quasistatic magnetic field $B_0$ parallel to the z-axis of the bore and having an intensity sufficient to excite a detectable magnetic resonance in magnetically active nuclei located within the selected arbitrary examination segment.

1040
Switching an electronically controllable radiofrequency amplifier of a group of at least two groups to a state responsive to the $B_1$ localization control signal and respectively amplifying the received pulse of radiofrequency electromagnetic waves in response thereto.

1050
Delivering the amplified received pulse of radiofrequency electromagnetic waves as an incident amplified pulse of radiofrequency electromagnetic waves to the at least two artificially structured electromagnetic unit cells of the group.

1060
Transforming, using the at least two artificially structured electromagnetic unit cells of the group of at least two groups, the incident amplified pulse of radiofrequency electromagnetic waves into the localized pulse of radiofrequency magnetic field $B_1$.

End

FIG. 14

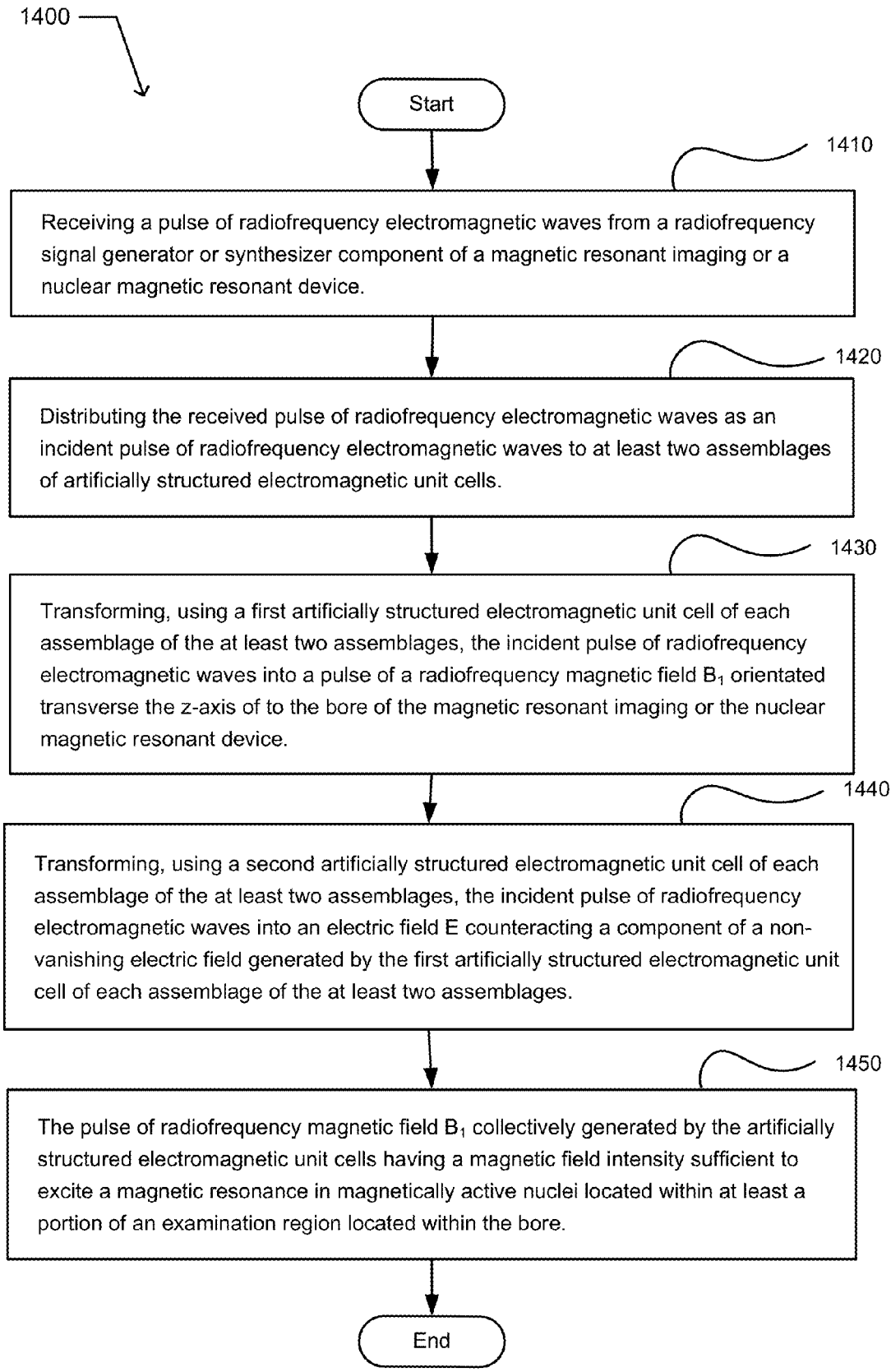

1400

1410 — Receiving a pulse of radiofrequency electromagnetic waves from a radiofrequency signal generator or synthesizer component of a magnetic resonant imaging or a nuclear magnetic resonant device.

1420 — Distributing the received pulse of radiofrequency electromagnetic waves as an incident pulse of radiofrequency electromagnetic waves to at least two assemblages of artificially structured electromagnetic unit cells.

1430 — Transforming, using a first artificially structured electromagnetic unit cell of each assemblage of the at least two assemblages, the incident pulse of radiofrequency electromagnetic waves into a pulse of a radiofrequency magnetic field $B_1$ orientated transverse the z-axis of to the bore of the magnetic resonant imaging or the nuclear magnetic resonant device.

1440 — Transforming, using a second artificially structured electromagnetic unit cell of each assemblage of the at least two assemblages, the incident pulse of radiofrequency electromagnetic waves into an electric field E counteracting a component of a non-vanishing electric field generated by the first artificially structured electromagnetic unit cell of each assemblage of the at least two assemblages.

1450 — The pulse of radiofrequency magnetic field $B_1$ collectively generated by the artificially structured electromagnetic unit cells having a magnetic field intensity sufficient to excite a magnetic resonance in magnetically active nuclei located within at least a portion of an examination region located within the bore.

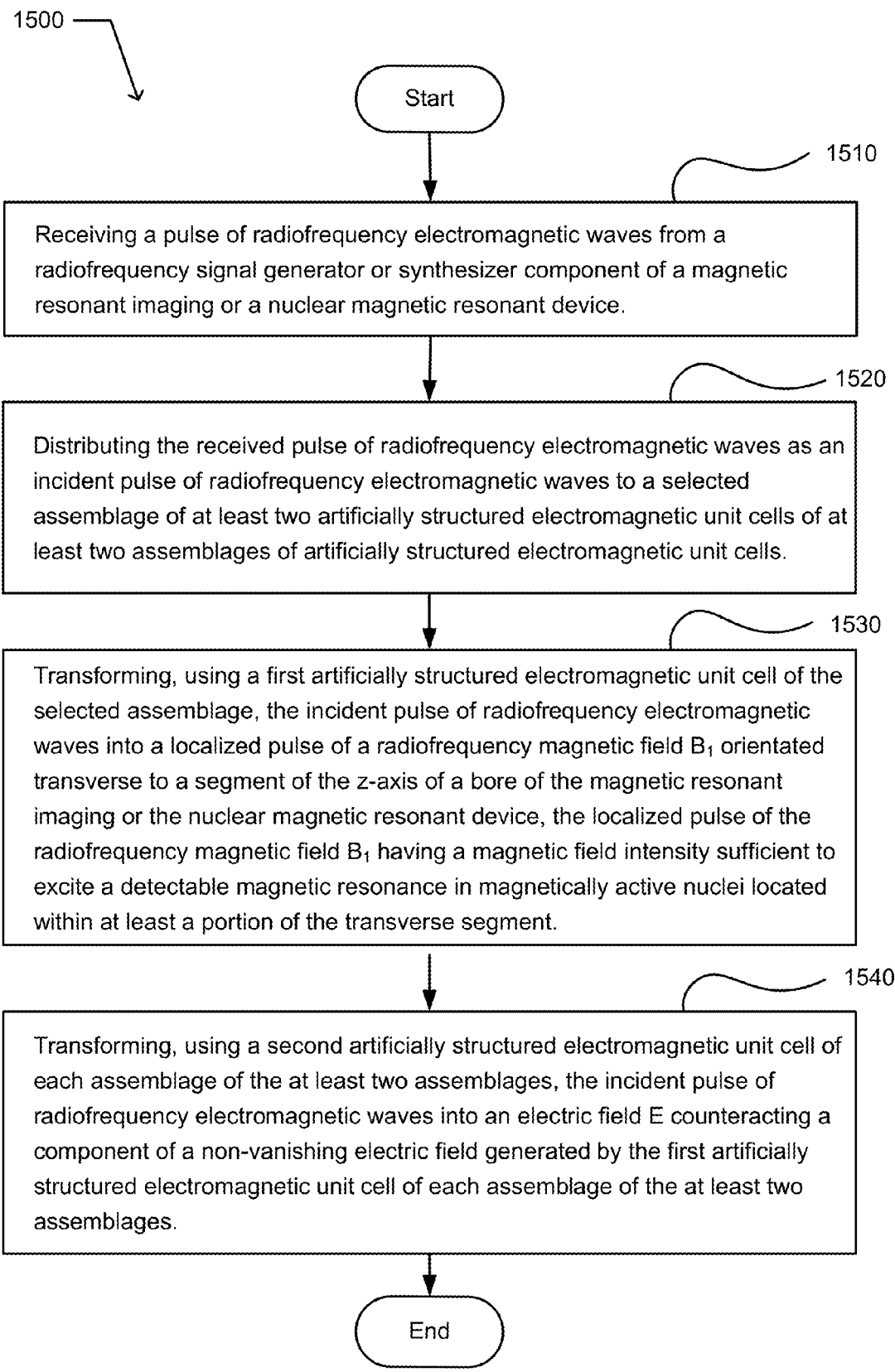

ARTIFICIALLY STRUCTURED UNIT CELLS PROVIDING LOCALIZED $B_1$ MAGNETIC FIELDS FOR MRI AND NMR DEVICES

If an Application Data Sheet (ADS) has been filed on the filing date of this application, it is incorporated by reference herein. Any applications claimed on the ADS for priority under 35 U.S.C. § § 119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 USC § 119(e) for provisional patent applications, for any and all parent, grandparent, great-grandparent, etc. applications of the Priority Application(s)).

PRIORITY APPLICATIONS

None.

If the listings of applications provided above are inconsistent with the listings provided via an ADS, it is the intent of the Applicant to claim priority to each application that appears in the Domestic Benefit/National Stage Information section of the ADS and to each application that appears in the Priority Applications section of this application.

All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

SUMMARY

For example, and without limitation, an embodiment of the subject matter described herein includes an apparatus. The apparatus includes an array of at least two groups of at least two artificially structured electromagnetic unit cells. Each group of the at least two groups is configured to be arranged in a respective plane perpendicular to the z-axis of the bore of a magnetic resonant imaging or a nuclear magnetic resonant device. Each group of the at least two groups of artificially structured electromagnetic unit cells configured to transform an incident pulse of radiofrequency electromagnetic waves into a pulse of radiofrequency magnetic field $B_1$ orientated transverse to a segment of the z-axis and spatially proximate to the group. The apparatus includes a radiofrequency electromagnetic wave conducting structure configured to selectively distribute a received pulse of radiofrequency electromagnetic waves to a group of the at least two groups.

In an embodiment, the at least two artificially structured electromagnetic unit cells of each group of at least two artificially structured electromagnetic unit cells include at least two assemblages of artificially structured electromagnetic unit cells. Each assemblage of the at least two assemblages of artificially structured electromagnetic unit cells including (i) a first artificially structured electromagnetic unit cell configured to transform an incident pulse of radiofrequency electromagnetic waves into a pulse of the radiofrequency magnetic field $B_1$ and (ii) a second artificially structured electromagnetic unit cell configured to transform the incident pulse of radiofrequency electromagnetic waves into an electric field E counteracting a non-vanishing electric field generated by the first artificially structured electromagnetic unit cell.

For example, and without limitation, an embodiment of the subject matter described herein includes a method. The method includes receiving a pulse of radiofrequency electromagnetic waves from a radiofrequency signal generator or signal synthesizer component of a magnetic resonant imaging or a nuclear magnetic resonant device. The method includes distributing the received pulse of radiofrequency electromagnetic waves as an incident pulse of radiofrequency electromagnetic waves to a selected group of an array of at least two groups of at least two artificially structured electromagnetic unit cells. The method includes transforming, using the at least two artificially structured electromagnetic unit cells of the selected group, the incident pulse of radiofrequency electromagnetic waves into a localized pulse of a radiofrequency magnetic field $B_1$ orientated transverse to the z-axis of a bore of the magnetic resonant imaging or the nuclear magnetic resonant device. The localized pulse of the radiofrequency magnetic field $B_1$ having a magnetic field intensity sufficient to excite a detectable magnetic resonance in magnetically active nuclei located within at least a portion of the transverse segment of an examination region located within the bore.

In an embodiment, the method includes selecting the group of at least two groups of at least two artificially structured electromagnetic unit cells in response to data indicative of a location along the z-axis of a transverse slice selected for examination.

For example, and without limitation, an embodiment of the subject matter described herein includes a system. The system includes an array of at least two groups of at least two artificially structured electromagnetic unit cells. Each group of the at least two groups configured to be respectively linearly arranged with respect to the z-axis of the bore of a magnetic resonant imaging or a nuclear magnetic resonant device. Each group of the at least two artificially structured electromagnetic unit cells respectively configured to transform incident pulses of radiofrequency electromagnetic waves into pulses of radiofrequency magnetic field $B_1$ orientated transverse to a segment of the z-axis and spatially proximate to the group. The system includes a radiofrequency electromagnetic wave conducting structure configured to distribute the pulses of radiofrequency electromagnetic waves as the incident pulses of the radiofrequency electromagnetic waves to a selectable group of the at least two groups in response to a $B_1$ localization control signal. The system includes a control circuit configured to generate the $B_1$ localization control signal defining a respective power distribution and phase delays (including zero and non-zero phase delays) of a particular incident pulse of radiofrequency electromagnetic waves to each group of the at least two groups. The respective power distribution collectively defining a particular pulse of radiofrequency magnetic field $B_1$ localized to a selected arbitrary examination segment transverse to the z-axis and within an examination region of the bore. The localized magnetic field $B_1$ having an intensity sufficient to excite a detectable magnetic resonance in magnetically active nuclei located within the selected arbitrary examination segment.

In an embodiment, the system includes a receiver configured to receive data indicative of a location along the z-axis of the transverse slice selected for examination. In an embodiment, the system includes a unit cell controller configured to electronically control the at least two electronically controllable, artificially structured electromagnetic unit cells of each group of the at least two groups in response to the gradient component of the control signal.

For example, and without limitation, an embodiment of the subject matter described herein includes a method. The method includes receiving a pulse of radiofrequency electromagnetic waves from a radiofrequency signal generator or signal synthesizer component of a magnetic resonant imaging or a nuclear magnetic resonant device. The method includes generating a $B_1$ localization control signal defining a respective power distribution of the pulse of radiofrequency electromagnetic waves to each group of the at least two groups of at least two artificially structured electromagnetic unit cells. Each group of the at least two groups is configured to be sequentially positioned in a respective plane transverse to the z-axis of the bore of the magnetic resonant imaging or the nuclear magnetic resonant device. The respective power distribution collectively defining a pulse of radiofrequency magnetic field $B_1$ localized to a selected arbitrary examination segment transverse to the z-axis and within an examination region of the bore. The method includes distributing the received pulse of radiofrequency electromagnetic waves as an incident pulse of radiofrequency electromagnetic waves to a group of the at least two groups in accord with the $B_1$ localization control signal. The method includes transforming, using the at least two artificially structured electromagnetic unit cells of the group, the incident pulse of radiofrequency electromagnetic waves into a localized pulse of a radiofrequency magnetic field $B_1$ orientated transverse to the selected arbitrary examination segment and having an intensity sufficient to excite a detectable magnetic resonance in magnetically active nuclei located within the selected arbitrary examination segment.

In an embodiment, the method includes selecting the arbitrary examination segment responsive to data indicative of a location of a slice along the z-axis a orientated transverse selected for examination.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 2 illustrates an example of the magnetic resonant imaging or nuclear magnetic resonant device 300 that includes an apparatus 310;

FIG. 2A illustrates an example of a cross-sectional view of the magnetic resonant imaging or a nuclear magnetic resonant device 300.

FIG. 2B illustrates an example of a view through the bore 316 of the magnetic resonant imaging or a nuclear magnetic resonant device 300.

FIG. 3 illustrates alternative embodiments of artificially structured electromagnetic unit cells 322;

FIG. 3A illustrates a unit cell 322A with concentric split rings insertion 324A.

FIG. 3B illustrates a unit cell 322B with a split ring insertion 324B having shoulders at the split.

FIG. 3C illustrates a unit cell 322C with concentric box split rings 324C insertion.

FIG. 3D illustrates a unit cell 322D with a conical helix insertion 324D.

FIG. 3E illustrates a unit cell 322E with an interleaved "L" rings insertion 324E.

FIG. 3F illustrates a unit cell 322F with an "I" inclusion 324F with broad shoulders.

FIG. 3G illustrates a unit cell 322G with an opposing box split rings insertion 324G.

FIG. 5 illustrates an example apparatus 500;

FIG. 6 illustrates an example apparatus 605 configured to generate a radiofrequency magnetic field $B_1$ in a magnetic resonant imaging or a nuclear magnetic resonant device;

FIG. 7 illustrates an example operational flow;

FIG. 8 illustrates an example operational flow 800;

FIG. 10 illustrates an example operational flow 1000;

FIG. 14 illustrates an example operational flow 1400; and

FIG. 15 illustrates an example operational flow 1500.

DETAILED DESCRIPTION

Figure 1:
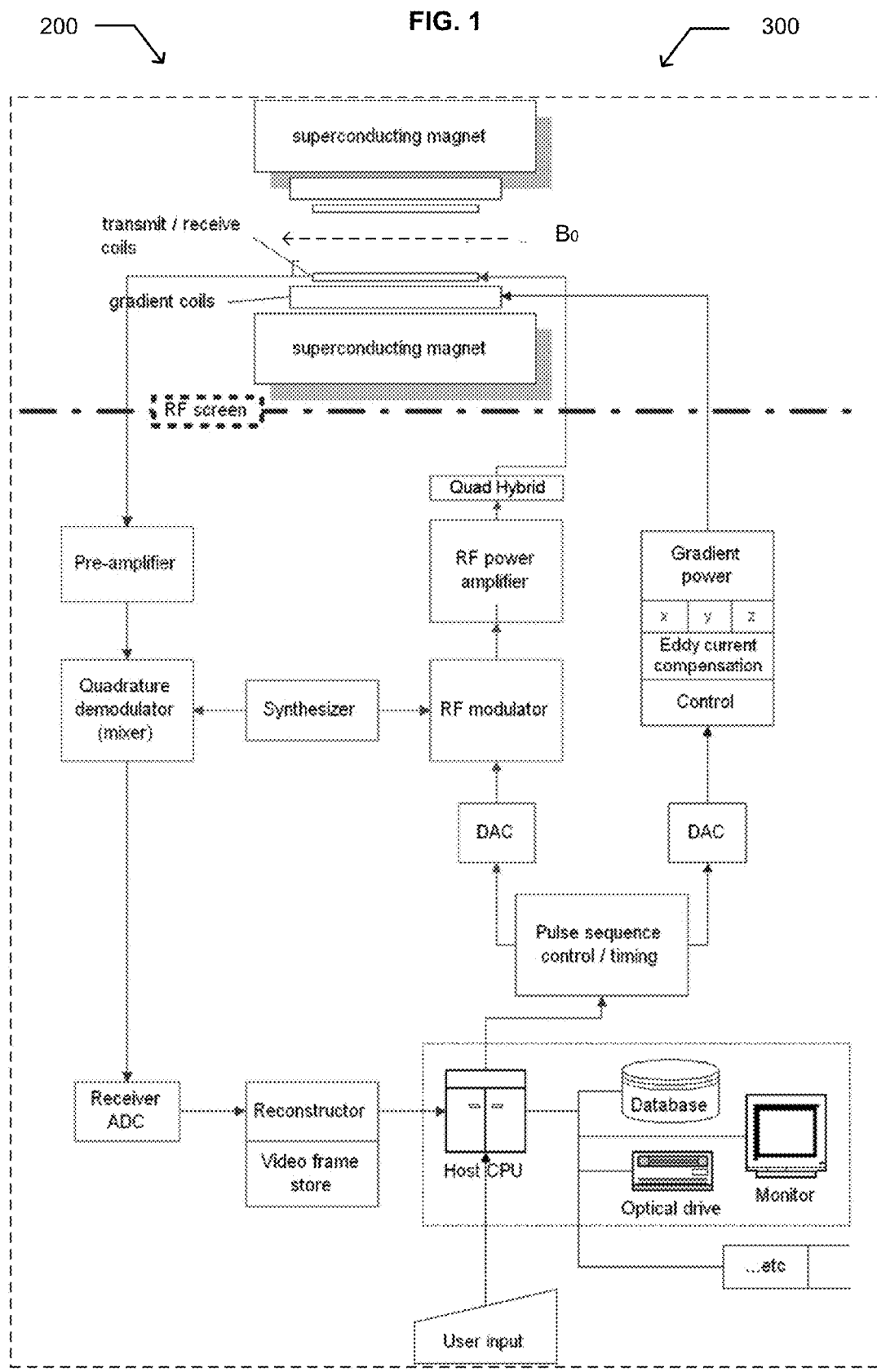
FIG. 1 illustrates an environment 200 that includes an example magnetic resonant imaging or a nuclear magnetic resonant device 300, including some of its systems.

This application makes reference to technologies described more fully in U.S. patent application Ser. No. 14/257,175, entitled SUB-NYQUIST HOLOGRAPHIC APERTURE ANTENNA CONFIGURED TO DEFINE SELECTABLE, ARBITRARY COMPLEX ELECTROMAGNETIC FIELDS, naming Pai-Yen Chen et al. as inventors, filed on Apr. 21, 2014, is related to the present application. That application is incorporated by reference herein, including any subject matter included by reference in that application.

This application makes reference to technologies described more fully in U.S. patent application Ser. No. 14/257,187, entitled SUB-NYQUIST HOLOGRAPHIC APERTURE ANTENNA CONFIGURED TO DEFINE SELECTABLE, ARBITRARY COMPLEX ELECTROMAGNETIC FIELDS, naming Pai-Yen Chen et al. as inventors, filed on Apr. 21, 2014, is related to the present application. That application is incorporated by reference herein, including any subject matter included by reference in that application.

This application makes reference to technologies described more fully in U.S. patent application Ser. No. 14/257,386, entitled SYSTEM WIRELESSLY TRANSFERRING POWER TO A TARGET DEVICE OVER A TESTED TRANSMISSION PATHWAY, naming Pai-Yen Chen et al. as inventors, filed on Apr. 21, 2014, is related to the present application. That application is incorporated by reference herein, including any subject matter included by reference in that application.

This application makes reference to technologies described more fully in U.S. patent application Ser. No. 14/257,415, entitled SYSTEM WIRELESSLY TRANSFER- RING POWER TO A TARGET DEVICE OVER A MODELED TRANSMISSION PATHWAY WITHOUT EXCEEDING A RADIATION LIMIT FOR HUMAN BEINGS, naming Pai-Yen Chen et al. as inventors, filed on Apr. 21, 2014, is related to the present application. That application is incorporated by reference herein, including any subject matter included by reference in that application.

This application makes reference to technologies described more fully in U.S. patent application Ser. No. 12/286,740, entitled BEAM POWER FOR LOCAL RECEIVERS, naming Roderick A. Hyde et al. as inventors, filed on Sep. 30, 2008, is related to the present application. That application is incorporated by reference herein, including any subject matter included by reference in that application.

This application makes reference to technologies described more fully in U.S. patent application Ser. No. 12/286,737, entitled BEAM POWER WITH MULTIPOINT BROADCAST, naming Roderick A. Hyde et al. as inventors, filed on Sep. 30, 2008, is related to the present application. That application is incorporated by reference herein, including any subject matter included by reference in that application.

This application makes reference to technologies described more fully in U.S. patent application Ser. No. 12/286,755, entitled BEAM POWER WITH MULTIPOINT RECEPTION, naming Roderick A. Hyde et al. as inventors, filed on Sep. 30, 2008, is related to the present application. That application is incorporated by reference herein, including any subject matter included by reference in that application.

This application makes reference to technologies described more fully in U.S. patent application Ser. No. 12/286,741, entitled BEAM POWER WITH BEAM REDIRECTION, naming Roderick A. Hyde et al. as inventors, filed on Sep. 30, 2008, is related to the present application. That application is incorporated by reference herein, including any subject matter included by reference in that application.

This application makes reference to technologies described more fully in U.S. Patent Application No. 61/455,171, entitled SURFACE SCATTERING ANTENNAS, naming Nathan Kundtz as inventor, filed Oct. 15, 2010, is related to the present application. That application is incorporated by reference herein, including any subject matter included by reference in that application.

This application makes reference to technologies described more fully in U.S. patent application Ser. No. 13/317,338, entitled SURFACE SCATTERING ANTENNAS, naming Adam Bily et al. as inventors, filed Oct. 14, 2011, is related to the present application. That application is incorporated by reference herein, including any subject matter included by reference in that application.

This application makes reference to technologies described more fully in U.S. patent application Ser. No. 13/838,934, entitled SURFACE SCATTERING ANTENNA IMPROVEMENTS, naming Adam Bily et al. as inventors, filed Mar. 15, 2013, is related to the present application. That application is incorporated by reference herein, including any subject matter included by reference in that application.

This application makes reference to technologies described more fully in U.S. patent application Ser. No. 14/102,253, entitled SURFACE SCATTERING REFLECTOR ANTENNA, naming Jeffrey A. Bowers et al. as inventors, filed Dec. 10, 2013, is related to the present application. That application is incorporated by reference herein, including any subject matter included by reference in that application.

This application makes reference to technologies described more fully in U.S. patent application Ser. No. 14/226,213, entitled SURFACE SCATTERING ANTENNA ARRAY, naming Jesse R. Cheatham, III et al. as inventors, filed Mar. 26, 2014, is related to the present application. That application is incorporated by reference herein, including any subject matter included by reference in that application.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

FIG. 1 illustrates an environment 200 that includes an example magnetic resonant imaging or a nuclear magnetic resonant device 300, including some of its systems. The magnetic resonant imaging or a nuclear magnetic resonant device includes a permanent or superconducting magnet generating a z-axis magnetic field $B_0$. For example the permanent or superconducting magnet may generate a magnetic field $B_0$ of at least 0.5 T. The magnetic resonant imaging or a nuclear magnetic resonant device includes a gradient coil device creating a temporal linear gradient in the magnetic field $B_0$ along the z-axis. In addition, the magnetic resonant imaging or a nuclear magnetic resonant device includes a device or apparatus configured to generate a radiofrequency magnetic field $B_1$ perpendicular to the z-axis.

FIG. 2A illustrates a cross-sectional view of magnetic resonant imaging or nuclear magnetic resonant device 300, and FIG. 2B illustrates a view through a bore of the device (FIGS. 2A and 2B are collectively referred to herein as FIG. 2). FIG. 2 illustrates an example of the magnetic resonant imaging or nuclear magnetic resonant device 300 that includes an apparatus 310. FIG. 2A is a cross-sectional view, and FIG. 2B is a view through the bore 316 of the magnetic resonant imaging or a nuclear magnetic resonant device. The nuclear magnetic resonant device includes a permanent or superconducting magnet 312 and a gradient coil device 314. The apparatus includes an array 320 of at least two artificially structured electromagnetic unit cells 322. Additional description of the unit cells in provided in conjunction with FIG. 3. The at least two artificially structured electromagnetic unit cells are configured to generate a pulse of radiofrequency magnetic field $B_1$ 328 orientated transverse to the quasistatic magnetic field $B_0$ parallel to the z-axis 318 of the bore 316 of the magnetic resonant imaging or a nuclear magnetic resonant device by transforming an incident pulse of radiofrequency electromagnetic waves. The generated pulse having magnetic field intensity sufficient to excite a detectable magnetic resonance in magnetically active nuclei located within at least a portion of an examination region located within the bore. The apparatus includes a radiofrequency electromagnetic wave conducting structure 380 configured to distribute a received pulse of radiofrequency electromagnetic waves as an incident pulse of radiofrequency electromagnetic waves to the at least two artificially structured electromagnetic unit cells. In an embodiment, the magnetic field $B_0$ is created by a primary magnet of the magnetic resonant imaging or the nuclear magnetic resonant device.

FIGS. 3A, 3B, 3C, 3D, 3E, 3F, and 3G illustrates alternative embodiments of artificially structured electromagnetic unit cells 322 (FIGS. 3A, 3B, 3C, 3D, 3E, 3F, and 3G are collectively referred to herein as FIG. 3). FIG. 3 illustrates alternative embodiments of artificially structured electromagnetic unit cells 322. In an embodiment, the artificially structured electromagnetic unit cells may include metamaterial unit cells. In an embodiment, the artificially structured electromagnetic unit cells may include a metamaterial cellular architecture. In an embodiment, a metamaterial includes an artificially structured material that gains its properties from its structure rather than its composition. In an embodiment, a metamaterial includes a macroscopic composite of a periodic or non-periodic structure, whose function is due to both its cellular architecture and chemical composition. Tie Jun Cui et al. ed., *Metamaterials: theory, design, and applications,* 2 (Springer 2010). In an embodiment, the artificially structured electromagnetic unit cells have a cellular size less than the wavelength of a radiofrequency involved. In an embodiment, the unit cells are arbitrarily shaped unit cells. In an embodiment, the unit cells are structured by artificial inclusions with a sub-wavelength size. In an embodiment, the array 320 of artificially structured unit cells responds to electric and magnetic fields as a homogeneous structure or an effective medium. In an embodiment, inclusions in a unit cell may be specifically designed for dielectric permittivity, magnetic permeability, and index of refraction, and placed at a desired location in the unit cell.

FIG. 3 illustrates example inclusions in unit cells. The unit cells may be resonant or non-resonant. FIG. 3A illustrates a unit cell 322A with concentric split rings insertion 324A. FIG. 3B illustrates a unit cell 322B with a split ring insertion 324B having shoulders at the split. FIG. 3C illustrates a unit cell 322C with concentric box split rings 324C insertion. FIG. 3D illustrates a unit cell 322D with a conical helix insertion 324D. FIG. 3E illustrates a unit cell 322E with an interleaved "L" rings insertion 324E. FIG. 3F illustrates a unit cell 322F with an "I" inclusion 324F with broad shoulders. FIG. 3G illustrates a unit cell 322G with an opposing box split rings insertion 324G. The selection of an inclusion for the unit cells 245 may be made by those skilled in the art responsive to the particular design requirements and materials available. Another example of inclusions in unit cells is the multi-turn rectangular planar spiral, or several such spirals lying in different planes and connected by conducting vias. When more than two such planar spirals are connected, they may be described as "three-dimensional meander line". The multi-turn rectangular spiral inclusions are described in more detail by Lipworth et al., *Scientific Reports* 4, 3642 (2014); doi:10.1038/srep03642. For example, see FIG. 5 of Lipworth. An illustration of coupled, multi-turn rectangular planar spiral inserts may be drawn from the Squid antenna implementations and inductive-coupling RFID tags.

Returning to FIG. 2, in an embodiment, the at least two artificially structured electromagnetic unit cells 322 includes at least two metamaterial unit cells. In an embodiment, a unit cell of the at least two artificially structured electromagnetic unit cells includes an artificially structured metamaterial unit cell with a strong magnetic response. In an embodiment, a unit cell of the at least two artificially structured electromagnetic unit cells includes an artificially structured, high inductance density metamaterial unit cells.

In an embodiment, the at least two artificially structured electromagnetic unit cells 322 include at least two periodically arranged, artificially structured electromagnetic unit cells. In an embodiment, the at least two artificially structured electromagnetic unit cells include at least two artificially structured sub-wavelength electromagnetic unit cells. In an embodiment, the at least two artificially structured electromagnetic unit cells respectively include a split ring resonator insertion optimized to generate a high inductance density. For example, see the split ring 324B of FIG. 3B. In an embodiment, the at least two artificially structured electromagnetic unit cells respectively include two orthogonally oriented split ring resonator insertions optimized to generate a high inductance density. In an embodiment, the at least two artificially structured electromagnetic unit cells respectively include three orthogonally oriented split ring resonator insertions optimized to generate a high inductance density. In an embodiment, the at least two artificially structured electromagnetic unit cells respectively include a spiral insertion optimized to generate a high inductance density. In an embodiment, the spiral insertion includes a rectangular or circular spiral insertion optimized to generate a high inductance density. In an embodiment, a unit cell of the at least two artificially structured electromagnetic unit cells includes a conical helix or cylindrical helix insertion optimized to generate a high inductance density. For example, see the conical helix insertion 324D of FIG. 3D. In an embodiment, a unit cell of the at least two artificially structured electromagnetic unit cells includes two orthogonally oriented conical helical insertions optimized to generate a high inductance density. In an embodiment, a unit cell of the at least two artificially structured electromagnetic unit cells includes three orthogonally oriented cylindrical helical insertions optimized to generate a high inductance density. In an embodiment, a unit cell of the at least two artificially structured electromagnetic unit cells includes a pyramidal helical insertion optimized to generate a high inductance density. In an embodiment, the at least two artificially structured electromagnetic unit cells are configured to induce a $B_1$ magnetic field component orthogonal to the z-axis. In an embodiment, the at least two artificially structured electromagnetic unit cells are configured to induce a first $B_1$ magnetic field component orthogonal to the z-axis and a second $B_1$ magnetic field component orthogonal to the first $B_1$ magnetic field component. In an embodiment, the at least two artificially structured electromagnetic unit cells are configured to induce magnetic field $B_1$ components in all three mutually orthogonal orientations.

In an embodiment, the artificially structured electromagnetic unit cells 322 include a sub-wavelength arrangement of magnetic dipole unit cells. For example, the sub-wavelength arrangement may include unit cells having cellular dimensions of less than one-half of a wavelength. For example, the sub-wavelength arrangement may include unit cells having cellular dimensions of less than one-quarter of a wavelength. For example, the sub-wavelength arrangement may include a deeply sub-wavelength arrangement. For example, the sub-wavelength arrangement may include unit cells having cellular dimensions of less than one-tenth of a wavelength. In an embodiment, the unit cells are densely packed to deliver a relatively large magnetic field or a large magnetic flux. In an embodiment, the artificially structured electromagnetic unit cells include a sub-wavelength arrangement of magnetic multipole unit cells. In an embodiment, the artificially structured electromagnetic unit cells include a deeply sub-wavelength arrangement of magnetic multipole unit cells.

In an embodiment, the array 320 is configured to generate a magnetic-field $B_1$ in the near-field region. In an embodiment, the at least two unit cells 322 are configured to generate a pulse of a tunable radiofrequency magnetic field $B_1$ 328. In an embodiment, the tunable radiofrequency magnetic field $B_1$ includes a frequency, amplitude, or polarization tunable radiofrequency magnetic field $B_1$. In an embodiment, the tunable radiofrequency magnetic field $B_1$ is tunable over a portion of the 10-300 MHz range. This frequency range is often used for magnetic resonant imaging or nuclear magnetic resonant imaging. In an embodiment, there is no true lower bound on the frequency used for magnetic resonant imaging or nuclear magnetic resonant imaging. If the primary field $B_0$ strength is low, the $B_1$ frequency may be correspondingly lower; and detection efficiency is correspondingly lower. In an embodiment, resonant unit cells producing the magnetic field B are loaded with additional capacitors in order to lower the resulting resonance frequency below their natural, unloaded resonance frequency. The upper frequency limit for the $B_1$ frequency results from high-frequency wave attenuation and electric field absorption in the body. Reducing total electric field absorption in the body allows use of higher radiofrequency magnetic fields $B_1$, enabling higher detection efficiency.

In an embodiment, the array 320 is configured to be coaxially disposed about the z-axis 318. In an embodiment, the array includes an arcuate shape dimensioned to be mounted or positioned within at least a portion of the bore 316 of the magnetic resonant imaging or the nuclear magnetic resonant device. In an embodiment, the arcuate shape is dimensioned to be mounted or positioned around less than 180-degrees of the circumference of the bore. In an embodiment, the arcuate shape is dimensioned to be mounted or positioned around 180-degrees or more of the circumference of the bore. In an embodiment, the shape is dimensioned to be mounted or positioned around less than 270-degrees of the circumference of the bore. In an embodiment, the array has a cylindrical or an annular shape dimensioned to be mounted or positioned within the bore of the magnetic resonant imaging or the nuclear magnetic resonant device. In an embodiment, the array includes two arcuate shaped portions, each dimensioned to be less than 180-degrees of the circumference of the bore, and mounted or positioned facing each other across the z-axis. In an embodiment, the array includes two generally planar portions, each configured to be mounted or positioned facing the other across the z-axis.

In an embodiment, the at least two artificially structured unit electromagnetic cells 322 are configured to generate a highly inductive electromagnetic near field 328. In an embodiment, the at least two artificially structured unit electromagnetic cells are configured to generate a magnetic field-dominant radiofrequency near-field whose magnetic ($B_1$) and electric ($E_1$) field intensities are such that $(B_1 c)/E_1 > 1$ (where "c" is the speed of light). In an embodiment, the at least two artificially structured electromagnetic unit cells are configured to generate a magnetic field-dominant radiofrequency near-field where $(B_1 c)/E_1 > 10$. For example, this is equivalent to $(H_1 \cdot Z_0)/E_1 > 10$ (where $Z_0$ is the free-space impedance). In an embodiment, the at least two artificially structured electromagnetic unit cells are configured to generate a magnetic field $B_1$ that includes a gradient orientated transverse to the z-axis 318. In an embodiment, the at least two artificially structured electromagnetic unit cells are configured to generate a magnetic field $B_1$ that includes two orthogonal gradients orientated transverse to the z-axis. In an embodiment, the pulse of radiofrequency magnetic field $B_1$ is linearly polarized relative to the z-axis.

In an embodiment, the pulse of radiofrequency magnetic field $B_1$ is circularly polarized relative to the z-axis.

In an embodiment, the array 320 of at least two electromagnetic unit cells 322 is further configured to receive magnetic resonance signals generated by magnetically active nuclei disposed in an examination region of a magnetic resonant imaging or a nuclear magnetic resonant device 300, and to generate a signal indicative thereof. In an embodiment, the radiofrequency electromagnetic wave conducting structure 380 is configured to distribute a received pulse of radiofrequency electromagnetic waves to the at least two artificially structured electromagnetic unit cells.

In an embodiment, the radiofrequency electromagnetic wave conducting structure 380 is configured to distribute a pulse of radiofrequency electromagnetic waves 392 received from a radiofrequency power amplifier component of the magnetic resonant imaging or a nuclear magnetic resonant device 300 to the at least two artificially structured electromagnetic unit cells 322. In an embodiment, the radiofrequency electromagnetic wave conducting structure includes a transmission line, a waveguide, or other field-confining structure allowing field propagation along at least one of its dimensions. In an embodiment, the waveguide includes a leaky waveguide, or another field-propagating structure with a partial field confinement. In an embodiment, the radiofrequency electromagnetic wave conducting structure includes a radiofrequency electrical conductor; for example, a high electrical conductivity wire.

In an embodiment, the pulse of radiofrequency electromagnetic waves 392 includes pulses of radiofrequency electromagnetic waves. In an embodiment, the pulse of radiofrequency electromagnetic waves is generated in response to a pulse programmer component of the magnetic resonant imaging or a nuclear magnetic resonant device 300. In an embodiment, the pulse of radiofrequency electromagnetic waves is generated by a radiofrequency oscillator component of the magnetic resonant imaging or a nuclear magnetic resonant device. In an embodiment, the pulse of radiofrequency electromagnetic waves is generated by a radiofrequency synthesizer component of the magnetic resonant imaging or a nuclear magnetic resonant device. In an embodiment, a frequency of the radiofrequency pulse is selected responsive to a resonate frequency of the at least two unit cells 322. In an embodiment, the radiofrequency pulse includes a shaped radiofrequency pulse. In an embodiment, the radiofrequency pulse includes a tailored radiofrequency sinc pulse or tailored radiofrequency sinc pulses.

In an embodiment, each unit cell of at least two artificially structured electromagnetic unit cells 322 includes a radiofrequency electromagnetic wave conducting component coupled with the radiofrequency electromagnetic wave conducting structure 380.

Figure 12:
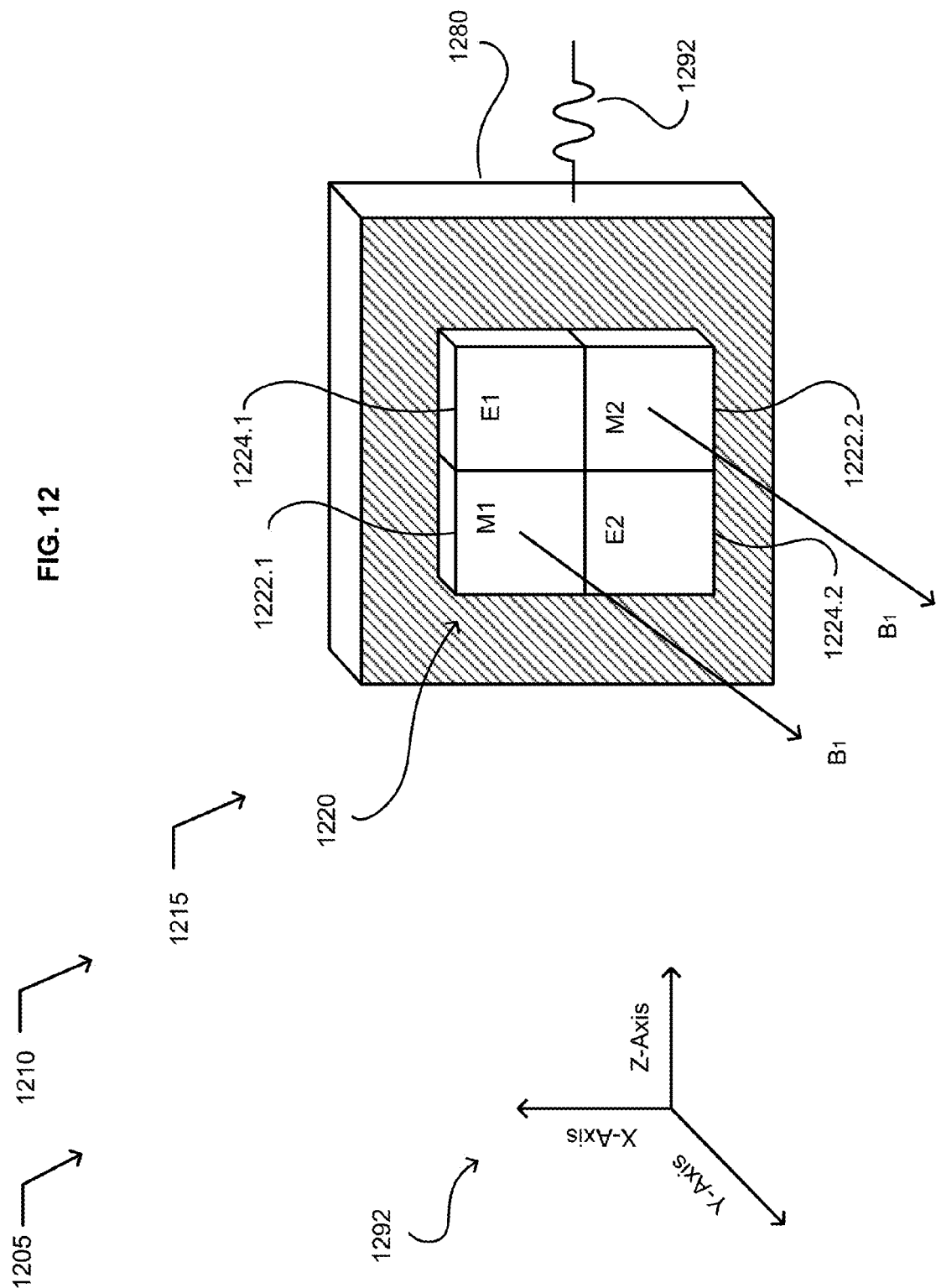
FIG. 12 illustrates an example apparatus 1205.

In an alternative embodiment, the at least two artificially structured electromagnetic unit cells 322 include at least two assemblages 1215 of artificially structured electromagnetic unit cells 1220. For example, FIG. 12 illustrates an assemblage of the at least two assemblages of artificially structured electromagnetic unit cells. Each assemblage includes a first artificially structured electromagnetic unit cell (illustrated as first unit cells 1222.1 and 1222.2) configured to generate the pulse of a radiofrequency magnetic field $B_1$, and a second artificially structured electromagnetic unit cell (illustrated as second unit cells 1224.1 and 1224.2) configured to generate a radiofrequency electric field E counter-acting a non-vanishing electric field generated by the first artificially structured electromagnetic unit cell. This assemblage decouples the strength of the radiofrequency magnetic field $B_1$ from the strength of the radiofrequency electric field E in a space, particularly in a near-field space.

Figure 4:
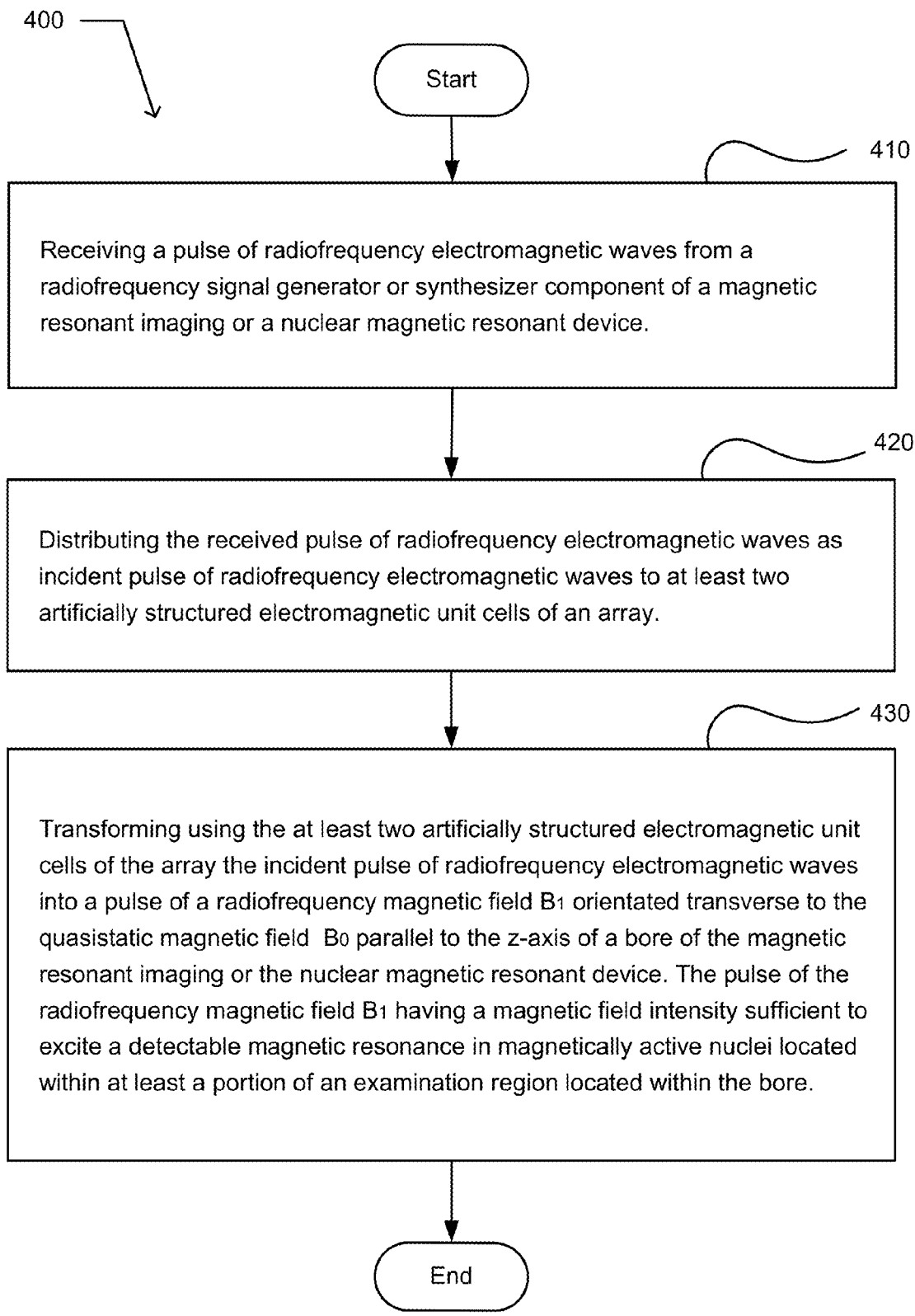
FIG. 4 illustrates an example operational flow 400.

FIG. 4 illustrates an example operational flow 400. After a start operation, the operational flow includes a reception operation 410. The reception operation includes receiving a pulse of radiofrequency electromagnetic waves from a radiofrequency signal generator or synthesizer component of a magnetic resonant imaging or a nuclear magnetic resonant device. In an embodiment, the reception operation may be implemented using the radiofrequency electromagnetic wave conducting structure 380 to receive the pulse 392 described in conjunction with FIG. 2. A dissemination operation 420 includes distributing the received pulse of radiofrequency electromagnetic waves as an incident pulse of radiofrequency electromagnetic waves to at least two artificially structured electromagnetic unit cells of an array. In an embodiment, the dissemination operation may be implemented using the radiofrequency electromagnetic wave conducting structure 380 to distribute the pulse 392 to the at least two artificially structured electromagnetic unit cells 322 of an array 320 described in conjunction with FIG. 2. A conversion operation 430 includes transforming, using the at least two artificially structured electromagnetic unit cells of the array, the incident pulse of radiofrequency electromagnetic waves into a pulse of a radiofrequency magnetic field $B_1$ orientated transverse to a quasistatic magnetic field $B_0$ that is parallel to a z-axis of a bore of the magnetic resonant imaging or the nuclear magnetic resonant device. The pulse of the radiofrequency magnetic field $B_1$ having a magnetic field intensity sufficient to excite a detectable magnetic resonance in magnetically active nuclei located within at least a portion of an examination region located within the bore. In an embodiment, the conversion operation may be implemented by the at least two artificially structured electromagnetic unit cells 322 of an array 320 described in conjunction with FIG. 2. The operational flow includes an end operation.

FIG. 5 illustrates an example apparatus 500. The apparatus includes means 510 for receiving a pulse of radiofrequency electromagnetic waves from a radiofrequency signal generator or synthesizer component of a magnetic resonant imaging or a nuclear magnetic resonant device. The apparatus includes means 520 for distributing the received pulse of radiofrequency electromagnetic waves as an incident pulse of radiofrequency electromagnetic waves to an artificially structured means for transforming radiofrequency electromagnetic waves. The apparatus includes artificially structured means 530 for transforming the incident pulse of radiofrequency electromagnetic waves into a pulse of a radiofrequency magnetic field $B_1$ orientated transverse to a quasistatic magnetic field $B_0$ parallel to a z-axis of a bore of the magnetic resonant imaging or the nuclear magnetic resonant device. The pulse of the radiofrequency magnetic field $B_1$ having a magnetic field intensity sufficient to excite a detectable magnetic resonance in magnetically active nuclei located within at least a portion of an examination region located within the bore.

FIG. 6 illustrates an example apparatus 605 configured to generate a radiofrequency magnetic field $B_1$ in a magnetic resonant imaging or a nuclear magnetic resonant device, for example, such as the magnetic resonant imaging or a nuclear magnetic resonant device 300 described in conjunction with the environment 200 in FIGS. 1 and 2. The apparatus includes an array 610 of at least two groups 620 of at least two artificially structured electromagnetic unit cells 624. The at least two groups are illustrated by a group 622.1, a group 622.2, a group 622.3, a group 622.4, and a group 622.5. Each group of the at least two groups is configured to be respectively linearly arranged with respect to the z-axis 318 of the bore 316 of the magnetic resonant imaging or a nuclear magnetic resonant device. An embodiment of at least two artificially structured electromagnetic unit cells 624 is illustrated as a 2×2 arrangement of artificially structured electromagnetic unit cells. In an embodiment for example, a group of the at least two artificially structured electromagnetic unit cells 624 may include an arrangement unit cells of hundreds or thousands of unit cells in a circumferential direction around the group, and tens or hundreds of unit cells across a width of the group. The artificial structure of unit cells, including inclusions, and the arrangement of the unit cells may be selected or designed by one skilled in the art responsive to the particular design requirements and materials available. For example, FIG. 3 and accompanying description illustrate several artificial structures of unit cells. Each group of the at least two groups 620 of artificially structured electromagnetic unit cells 624 is configured to transform an incident pulse 692 of radiofrequency electromagnetic waves into a pulse of radiofrequency magnetic field $B_1$ orientated transverse to a segment of the z-axis 318 (hereafter "transverse segment") and spatially proximate to the group.

For example, the group 622.1 of unit cells is configured to transform the incident pulse into a pulse of radiofrequency magnetic field $B_{1.1}$ orientated transverse to a segment of the z-axis, and having a substantial portion of the radiofrequency magnetic field $B_{1.1}$ intensity proximate to the group 622.1. While ultimately a function of design and materials selected for the array, in an example operational embodiment of the array 610, the intensity of the radiofrequency magnetic field $B_{1.1}$ proximate to the group 622.1 may be at least five times the intensity of the radiofrequency magnetic field $B_{1.5}$ proximate to the group 622.5. Similarly, in another example operational embodiment, the intensity of the radiofrequency magnetic field $B_{1.3}$ proximate to the group 622.3 may be at least two times the intensity of the radiofrequency magnetic fields $B_{1.1}$ and $B_{1.5}$ respectively proximate to the groups 622.1 and 622.5.

The apparatus 605 includes a radiofrequency electromagnetic wave conducting structure 680 configured to selectively distribute a received pulse of radiofrequency electromagnetic waves 692 to a group of the at least two groups 620. In an embodiment, the selectively distribute is responsive to a control signal 673 generated by a controller 672.

In an embodiment, each group of the at least two groups 620 of artificially structured electromagnetic unit cells 624 is configured to transform an incident pulse of radiofrequency electromagnetic waves 692 into a pulse of radiofrequency magnetic field $B_1$ having a magnetic field intensity sufficient to excite a detectable magnetic resonance in magnetically active nuclei located within the transverse segment spatially proximate to the group.

In an embodiment, a group of the at least two groups 620 has an annular shape. In an embodiment, each group of the at least two groups has an annular shape. In an embodiment, each group of the at least two groups is configured to be coaxially arranged about the z-axis 318. In an embodiment, each group of the at least two groups is configured to be coaxially arranged and sequentially positioned about the z-axis. In an embodiment, each group of the at least two groups is configured to be sequentially positioned in a respective plane transverse to the z-axis.

In an embodiment, each group of the at least two groups 620 is configured to transform an incident pulse 692 of radiofrequency electromagnetic waves into a pulse of radiofrequency magnetic field $B_1$ orientated transverse to a segment of the quasistatic magnetic field $B_0$ parallel to the z-axis 318 and spatially proximate to the group.

In an embodiment, the at least two groups 620 each include at least two randomly accessible groups of at least two artificially structured electromagnetic unit cells 625. In an embodiment, the at least two artificially structured electromagnetic unit cells of a group of the at least two randomly accessible groups include at least two electronically controllable artificially structured electromagnetic unit cells. In an embodiment, the at least two artificially structured electromagnetic unit cells of a group of the at least two randomly accessible groups include at least two active, artificially structured electromagnetic unit cells. For example, active, artificially structured electromagnetic unit cells may include active lumped element unit cells. For example, active, artificially structured electromagnetic unit cells may include electronically controllable or switchable unit cells. In an embodiment, the at least two artificially structured electromagnetic unit cells of a group include at least two powered, artificially structured electromagnetic unit cells. An example of a powered, artificially structured electromagnetic unit cell is described in Y. Yuan, et al., *Zero loss magnetic metamaterials using powered active unit cells*, Vol. 17, No. 18 Optics Express 13136 (Aug. 31, 2009). In an embodiment, the at least two artificially structured electromagnetic unit cells include at least two self-resonant, artificially structured electromagnetic unit cells. In an embodiment, the at least two artificially structured electromagnetic unit cells include at least two electrically-controllable, artificially structured electromagnetic unit cells. In an embodiment, the at least two artificially structured electromagnetic unit cells of a group include at least two randomly accessible, artificially structured electromagnetic unit cells. In an embodiment, the at least two artificially structured electromagnetic unit cells of a group are configured to generate a pulse of a tunable radiofrequency magnetic field $B_1$. In an embodiment, tunable radiofrequency magnetic field includes tunable over a portion of the 10-300 MHz range typically used by a magnetic resonant imaging or a nuclear magnetic resonant devices 300.

In an embodiment, a first group of the at least two groups 620 includes at least two artificially structured unit electromagnetic cells 624 configured to generate a magnetic field-dominant radiofrequency near-field whose magnetic and electric field intensities are such that $(B_1 c)/E_1 > 1$. A second group of the at least two groups includes at least two artificially structured unit electromagnetic cells configured to generate an electric field counteracting a non-vanishing electric field generated by the first group of artificially structured electromagnetic unit cells.

In an embodiment, the at least two artificially structured electromagnetic unit cells 624 of each group of at least two groups 620 include at least two assemblages of artificially structured electromagnetic unit cells. For example, FIG. 12 illustrates an assemblage 1215 of the at least two assemblages of artificially structured electromagnetic unit cells. In this embodiment, each assemblage of the at least two assemblages of artificially structured electromagnetic unit cells includes (i) a first artificially structured electromagnetic unit cell (illustrated as the first unit cells 1222.1 and 1222.2) configured to transform an incident pulse of radiofrequency electromagnetic waves into a pulse of the radiofrequency magnetic field $B_1$ and (ii) a second artificially structured electromagnetic unit cell (illustrated as the second unit cells 1224.1 and 1224.2) configured to transform the incident pulse of radiofrequency electromagnetic waves into an electric field E counteracting a non-vanishing electric field component generated by the first artificially structured electromagnetic unit cell.

FIG. 7 illustrates an example operational flow. After a start operation, the operational flow includes a reception operation 710. The reception operation includes receiving a pulse of radiofrequency electromagnetic waves from a radiofrequency signal generator or signal synthesizer component of a magnetic resonant imaging or a nuclear magnetic resonant device. In an embodiment, the reception operation may be implemented by the radiofrequency electromagnetic wave conducting structure 680 receiving the pulse 692 as described in conjunction with FIG. 6. A dissemination operation 720 includes distributing the received pulse of radiofrequency electromagnetic waves as an incident pulse of radiofrequency electromagnetic waves to a selected group of an array of at least two groups of at least two artificially structured electromagnetic unit cells. In an embodiment, the dissemination operation may be implemented by using a respective radiofrequency electromagnetic wave conducting sub-structure coupled to each group of the at least two groups 620 of the artificially structured electromagnetic unit cells 624, illustrated in FIG. 6 as sub-structures 682.1-682.5. A conversion operation 730 includes transforming, using the at least two artificially structured electromagnetic unit cells of the selected group, the incident pulse of radiofrequency electromagnetic waves into a localized pulse of a radiofrequency magnetic field $B_1$ orientated transverse to a z-axis of a bore of the magnetic resonant imaging or the nuclear magnetic resonant device. In an embodiment, the conversion operation may be implemented using the at least two artificially structured electromagnetic unit cells of the selected group of the at least two groups 620, such as for example the group 622.3 described in conjunction with FIG. 6. The operational flow includes an end operation.

In an embodiment of the conversion operation 730, the localized pulse 740 of the radiofrequency magnetic field $B_1$ has a magnetic field intensity sufficient to excite a detectable magnetic resonance in magnetically active nuclei located within at least a portion of the transverse segment of an examination region located within the bore. In an embodiment of the conversion operation, the transforming includes transforming an incident pulse of radiofrequency electromagnetic waves into a pulse of radiofrequency magnetic field $B_1$ transverse to a segment of the quasistatic magnetic field $B_0$ parallel to the z-axis and spatially proximate to the group. In an embodiment, the operational flow includes selecting the group of the at least two groups of at least two artificially structured electromagnetic unit cells in response to data indicative of a location along the z-axis of a transverse slice selected for examination.

Returning to FIG. 6: FIG. 6 also illustrates a system 602 that includes an alternative embodiment of the example system 602 and apparatus 605 configured to generate a radiofrequency magnetic field $B_1$ in a magnetic resonant imaging or a nuclear magnetic resonant device, for example, such as the magnetic resonant imaging or a nuclear magnetic resonant device 300 described in conjunction with the environment 200 in FIG. 1. The system includes an array 610 of at least two groups 620 of at least two artificially structured electromagnetic unit cells 624. Each group of the at least two groups configured to be respectively linearly arranged with respect to the z-axis 318 of the bore 316 of a magnetic resonant imaging or a nuclear magnetic resonant device. Each group of the at least two artificially structured electromagnetic unit cells is respectively configured to transform incident pulses 692 of radiofrequency electromagnetic waves into pulses of radiofrequency magnetic field $B_1$ orientated transverse to a segment of the z-axis 318 (hereafter "transverse segment) and spatially proximate to the group.

The system 602 includes a radiofrequency electromagnetic wave conducting structure 680 configured to distribute the pulses 692 of radiofrequency electromagnetic waves as the incident pulses of the radiofrequency electromagnetic waves to a selectable group of the at least two groups 620 in response to a $B_1$ localization control signal 673. The system includes a control circuit 672 configured to generate the $B_1$ localization control signal defining a respective power distribution of a particular incident pulse of radiofrequency electromagnetic waves to each group of the at least two groups. The respective power distribution collectively defining a particular pulse of radiofrequency magnetic field $B_1$ localized to a selected arbitrary examination segment transverse to the z-axis 318 and within an examination region of the bore 316. The localized magnetic field $B_1$ having an intensity sufficient to excite a detectable magnetic resonance in magnetically active nuclei located within the selected arbitrary examination segment.

In an embodiment, each group of the at least two groups 620 is respectively individually accessible or controllable independent of their respective location or sequence in the array 610. For example, any group of unit cells may be accessed or controlled as about as easily and efficiently as any other group of unit cells in the array, no matter how many other groups there are in the array. In an embodiment, individually accessible or controllable includes an ability to access or control any group of at least two unit cells in the array independent of its position, size, characteristic, etc. in the array. In an embodiment, each group of the at least two groups is respectively electronically accessible or controllable independent of the other groups. In an embodiment, the selected arbitrary examination segment includes a selected cylindrical arbitrary transverse segment having a centerline on the z-axis 318. In an embodiment, the selected arbitrary examination segment includes a selected arbitrary segment transverse to and having a thickness relative to the z-axis. In an embodiment, the selected arbitrary examination segment includes at least one transverse segment spatially proximate to a group of the at least two groups. In an embodiment, the selected arbitrary examination segment includes within its z-axis boundaries a transverse slice of the examination region selected for examination. In an embodiment, the localized pulse has a magnetic field intensity sufficient to excite a detectable magnetic resonance in magnetically active nuclei located within the transverse slice of the examination region.

In an embodiment, the system 602 includes a receiver 674 configured to receive data indicative of a location along the z-axis 318 of the transverse slice selected for examination. In an embodiment, the control circuit 672 is configured to select the arbitrary examination segment responsive to the data indicative of the location of the slice along the z-axis.

In an embodiment, the localized pulse of the radiofrequency magnetic field $B_1$ produces a quasi-focused radiofrequency magnetic field $B_1$ localized to include the selected arbitrary examination segment. In an embodiment, the localized pulse of the radiofrequency magnetic field $B_1$ produces a near-field magnetic field fan beam pattern localized to include the selected arbitrary examination segment. In an embodiment, the localized pulse has a magnetic field intensity sufficient to excite a detectable magnetic resonance in magnetically active nuclei in a potential examination subject located in the selected arbitrary examination segment. For example, a potential examination subject may include a human being, an animal subject, or an inanimate object.

Advantages of the example system 602 and apparatus 605 include producing lower electric field densities (and correspondingly SAR) than would be generated by a "standard", magnetic field $B_1$ generator of a traditional magnetic resonant imaging or a nuclear magnetic resonant device, particularly in the examination slice itself. The example system and apparatus produce an average E/(Bc) ratio in the examination slice that is less than what it would be inside a simple solenoidal generator of the same size operating at the same frequency and producing the same average B field intensity of a traditional magnetic resonant imaging or a nuclear magnetic resonant device.

In an embodiment, the localized pulse of the radiofrequency magnetic field $B_1$ includes a first electric field intensity in the selected arbitrary examination segment and includes a second electric field intensity in another arbitrary transverse segment of the examination region, the second electric field intensity less than the first electric field intensity. For example, the group 622.3 may create a localized pulse of the radiofrequency magnetic field $B_{1.3}$ and an accompanying first electric field intensity in the selected arbitrary examination segment proximate to the group 622.4, and an accompanying second electric field intensity in another arbitrary transverse segment proximate to the group 622.2. In an embodiment, the other arbitrary transverse segment abuts the selected arbitrary examination segment. In an embodiment, the other arbitrary transverse segment has a z-axis thickness along the z-axis equal to or greater than the selected arbitrary transverse segment. In an embodiment, the localized pulse of the radiofrequency magnetic field $B_1$ includes a first radiofrequency electric field intensity in the selected arbitrary examination segment and includes a second radiofrequency electric field intensity in a second arbitrary transverse segment of the examination region. The second radiofrequency electric field intensity is less than the first radiofrequency electric field intensity.

The formula for computing energy density or energy per unit volume $$\frac{dU}{dV}$$

of an electrostatic or quasistatic field is:

$$u_e = \frac{1}{2}\varepsilon_0|E|^2, \text{ Joules/M}^3.$$

In human tissue $\varepsilon_0$ is replaced with $\varepsilon'$, the real part of the dielectric permittivity of the tissue. The formula for the dissipation rate density is similar; it is the same as above, but $\varepsilon'$ is replaced with the electrical conductivity $\sigma$: Q=

$$\frac{1}{2}\sigma|\vec{E}|^2.$$

The specific absorption rate (measured in W/kg) is defined as the dissipation rate density (measured in W/m3) divided by density.

In an embodiment, the second arbitrary transverse segment abuts the selected arbitrary examination segment. In an embodiment, the second arbitrary transverse segment has a z-axis thickness equal to or greater than the selected arbitrary examination segment. In an embodiment, the second radiofrequency electric field intensity is less than 66% of the first radiofrequency electric field intensity. In an embodiment, the second electric field intensity is less than 50% of the first electric field intensity. In an embodiment, the second electric field intensity is less than 33% of the first electric field intensity.

In an embodiment, the respective power distribution further collectively defining a particular pulse of radiofrequency magnetic field $B_1$ producing a minimized specific absorption rate (SAR) in the selected arbitrary examination segment. In an embodiment, the defined particular pulse of radiofrequency magnetic field $B_1$ is configured in response to a model-based estimation of the localized pulse respective power distribution providing a minimized SAR. In an embodiment, the model-based estimation is optimized responsive to a set of configurable rules. In an embodiment, the model-based estimation of a respective power distribution is selected from a best available distribution scheme from at least two available distribution schemes. In an embodiment, the model-based estimation of a respective power distribution is retrieved from a computer readable storage medium. In an embodiment, the respective power distribution is empirical-determined on the fly. In an embodiment, the respective power distribution is responsive to a contemporaneously-determined distribution of a radiofrequency magnetic field $B_1$ localized to the selected arbitrary examination segment with the minimized SAR. In an embodiment, the contemporaneously-determined distribution is responsive to data contemporaneously received from at least one radiofrequency electric field sensor. In an embodiment, the contemporaneously-determined distribution is responsive to a set of rules. In an embodiment, the respective power distribution is selected responsive to a matrix factorization, or a matrix decomposition based optimization technique. In an embodiment, the respective power distribution is selected responsive to a gradient descent based optimization technique. In an embodiment, the respective power distribution is selected responsive to a singular value decomposition optimization technique. In an embodiment, the respective power distribution is selected responsive to a principle component analysis based optimization technique. In an embodiment, the respective power distribution is selected responsive to a trial and error, or a brute force based optimization technique. In an embodiment, the respective power distribution is selected responsive to a best available respective power distribution.

In an embodiment, the localized pulse of the radiofrequency magnetic field $B_1$ includes (i) a first radiofrequency electric field intensity in the selected arbitrary examination segment, (ii) a second radiofrequency electric field intensity in a second arbitrary transverse segment of the examination region abutting the selected arbitrary transverse segment, and (iii) a third radiofrequency electric field intensity in a third arbitrary transverse segment of the examination region abutting the selected arbitrary transverse segment and positioned opposite to the second arbitrary transverse segment. In this embodiment, the second and third radiofrequency electric field intensities are each less than the first radiofrequency electric field intensity. In an embodiment, the third arbitrary transverse segment has a z-axis thickness equal to or greater than the selected arbitrary examination segment. In an embodiment, the second radiofrequency electric field intensity is less than 66% of the first radiofrequency electric field intensity. In an embodiment, the second electric field intensity is less than 50% of the first electric field intensity. In an embodiment, the second electric field intensity is less than 33% of the first electric field intensity.

In an embodiment, the localized pulse of the radiofrequency magnetic field $B_1$ is configured to produce a first specific absorption rate (SAR) (W/kg) in an examination subject located in the selected arbitrary examination segment, and to produce a second SAR in another arbitrary transverse segment of the examination region, the second SAR less than the first SAR. In an embodiment, the second SAR is less than 66% of the first SAR. In an embodiment, the second SAR is less than 50% of the first SAR. In an embodiment, the second SAR is less than 33% of the first SAR. In an embodiment, the radiofrequency magnetic field $B_1$ includes a pulse of tunable radiofrequency magnetic field $B_1$.

In an embodiment, the respective power distribution further includes a respective power distribution collectively defining a particular pulse of radiofrequency magnetic field $B_1$ producing a minimized specific absorption rate (SAR) in the selected arbitrary examination segment. In an embodiment, the defined particular pulse of radiofrequency magnetic field $B_1$ is configured in response to a model-based estimation of the localized pulse respective power distribution providing a minimized SAR. In an embodiment, the model-based estimation is optimized responsive to a set of configurable rules. In an embodiment, the model-based estimation of a respective power distribution is selected from a best available distribution scheme from at least two available distribution schemes. In an embodiment, the model-based estimation of a respective power distribution is retrieved from a computer readable storage medium. In an embodiment, the respective power distribution is empirical-determined on the fly. In an embodiment, the respective power distribution is responsive to a contemporaneously-determined distribution of a radiofrequency magnetic field $B_1$ localized to the selected arbitrary examination segment with the minimized SAR. In an embodiment, the contemporaneously-determined distribution is responsive to data contemporaneously received from at least one radiofrequency electric field sensor. In an embodiment, the contemporaneously-determined distribution is responsive to a set of rules. In an embodiment, the respective power distribution is selected responsive to a matrix factorization, or a matrix decomposition based optimization technique. In an embodiment, the respective power distribution is selected responsive to a gradient descent based optimization technique. In an embodiment, the respective power distribution is selected responsive to a singular value decomposition optimization technique. In an embodiment, the respective power distribution is selected responsive to a principle component analysis based optimization technique. In an embodiment, the respective power distribution is selected responsive to a trial and error, or a brute force based optimization technique. In an embodiment, the respective power distribution is selected responsive to a best available respective power distribution.

In an embodiment, the respective power distribution further includes a respective power distribution collectively defining a particular pulse of radiofrequency magnetic field $B_1$ producing a selected ratio of the total specific absorption rate (SAR) produced in an examination subject over an averaged total SAR produced in the selected arbitrary examination segment. In an embodiment, the selected ratio includes a selected minimized ratio. In an embodiment, the selected ratio is selected in response to a model-based estimation of the total specific absorption rate (SAR) produced in an examination subject over an averaged total SAR produced in the selected arbitrary examination segment. In an embodiment, the selected ratio is selected responsive to a set of rules. In an embodiment, the selected ratio is selected responsive to a matrix factorization, or a matrix decomposition based optimization technique. In an embodiment, the selected ratio is selected responsive to a gradient descent based optimization technique. In an embodiment, the selected ratio is selected responsive to a singular value decomposition optimization technique.

In an embodiment, the array 620 of at least two groups 620 is electronically controllable to initiate a generation of the pulse of the radiofrequency magnetic field $B_1$ to the selected arbitrary segment.

In an embodiment, the radiofrequency electromagnetic wave conducting structure 680 is configured to receive the pulse 692 of radiofrequency electromagnetic waves from a radiofrequency power amplifier component of the magnetic resonant imaging or a nuclear magnetic resonant device 300. See FIGS. 1 and 2. In an embodiment, the radiofrequency electromagnetic wave conducting structure includes an electronically controllable switch 686 responsive to the $B_1$ localization control signal 673 and coupled between a primary portion of the radiofrequency electromagnetic wave conducting structure and a secondary portion 682 of the radiofrequency electromagnetic wave conducting structure. The secondary portion is coupled to at least one group of the at least two groups 620. In an embodiment, the secondary portion of the radiofrequency electromagnetic wave conducting structure includes a respective radiofrequency electromagnetic wave conducting sub-structure coupled to each group of the at least two groups of artificially structured electromagnetic unit cells. For example, a wave conducting sub-structure portion 682.1 is coupled between the conducting structure 680 and the group 622.1. Similarly, wave conducting sub-structure portions 682.2-682.5 are respectively coupled between the primary portion of the radiofrequency electromagnetic wave conducting structure and the groups 622.2-622.5.

In an embodiment, the respective power distribution defines a pulse of radiofrequency magnetic field $B_1$ orientated transverse to the z-axis 318 and within the examination region of the bore 316. In an embodiment, the selected arbitrary examination segment includes within its z-axis boundaries a transverse slice selected for examination. For example, during an imaging procedure, the selected examination segment is stepped or moved along the z-axis. In this example, the localized pulse of the radiofrequency magnetic field $B_1$ is selectively stepped or moved along the z-axis by selecting which group or groups of at least two unit cells receive the distribution of the pulse 692 of radiofrequency electromagnetic waves.

In an embodiment, the localized pulse has a magnetic field intensity sufficient to excite a detectable magnetic resonance in magnetically active nuclei located within the transverse slice of selected arbitrary examination segment.

In an embodiment, the respective power distribution defines a particular pulse of radiofrequency magnetic field $B_1$ localized to the selected arbitrary examination segment and having a substantially uniform magnetic field intensity. In an embodiment, the substantially uniform magnetic field intensity includes less than an approximately one-tenth of a percent variation in the radiofrequency magnetic field $B_1$ intensity across the selected arbitrary examination segment. In an embodiment, the substantially uniform magnetic field intensity includes less than an approximately one percent variation in the radiofrequency magnetic field $B_1$ intensity across the selected arbitrary examination segment. In an embodiment, the substantially uniform magnetic field intensity includes less than an approximately ten percent variation in the radiofrequency magnetic field $B_1$ intensity across the selected arbitrary examination segment. In an embodiment, the substantially uniform magnetic field intensity includes a variation in the radiofrequency magnetic field $B_1$ intensity across the selected arbitrary examination segment by a factor of less than two. In an embodiment, the substantially uniform magnetic field intensity includes a variation in the radiofrequency magnetic field $B_1$ intensity across the selected arbitrary examination segment by a factor of less than ten.

In an embodiment, the respective power distribution includes a model-based estimation of a respective power distribution providing a pulse of radiofrequency magnetic field $B_1$ localized to the selected arbitrary examination segment. In an embodiment, the model-based estimation is optimized responsive to a set of rules. For example, the rules may be configurable. In an embodiment, the model-based estimation of a respective power distribution is selected from a best available distribution scheme from at least two available distribution schemes. In an embodiment, the model-based estimation of a respective power distribution is retrieved from a computer readable storage medium. In an embodiment, the respective power distribution is empirically-determined on the fly. In an embodiment, the model-based estimation of a respective power distribution is responsive to a contemporaneously-determined distribution of a radiofrequency magnetic field $B_1$ localized to the selected arbitrary examination segment. In an embodiment, the model-based estimation of a respective power distribution is responsive to data contemporaneously received from at least one radiofrequency magnetic field sensor positioned within the bore. In an embodiment, the model-based estimation of a respective power distribution is responsive to a detected magnetic resonance in magnetically active nuclei located within at least a portion of the examination region. For example, the detected magnetic resonance may be from a previous localized pulse. For example, if the pulse amplitude is not strong enough to detect magnetic resonance, or is too strong, the amplitude of pulse may be changed by altering the distribution.

In an embodiment, the respective power distribution defines an optimized pulse of the radiofrequency magnetic field $B_1$ localized to the selected arbitrary examination segment. In an embodiment, the optimized pulse is selected responsive to a set of rules. In an embodiment, the optimized pulse is selected responsive to a matrix factorization, or a matrix decomposition based optimization technique. In an embodiment, the optimized pulse is selected responsive to a gradient descent based optimization technique. In an embodiment, the optimized pulse is selected responsive to a singular value decomposition optimization technique. In an embodiment, the optimized pulse is selected responsive to a principle component analysis based optimization technique. In an embodiment, the optimized pulse is selected responsive to a trial and error, or a brute force based optimization technique. In an embodiment, the optimized pulse is selected responsive to a best available respective power distribution. In an embodiment, the optimized pulse includes a pulse of radiofrequency magnetic field $B_1$ localized to the selected arbitrary examination segment and having magnetic field intensity sufficient to excite a detectable magnetic resonance in magnetically active nuclei located within the selected arbitrary examination segment. The optimized pulse is subject to a constraint limiting the electric field intensity within the transverse segment to less than a preselected value.

In an embodiment, the unit cells 624 of each group of the at least two groups 620 include at least two electronically controllable, artificially structured electromagnetic unit cells. In an embodiment, the unit cells of each group of the at least two groups include at least two electronically controllable, randomly accessible, artificially structured electromagnetic unit cells. For example, the unit cells may be randomly accessible individually or in groups.

In an embodiment, the respective power distribution defined by the control signal 673 further includes a gradient component of the radiofrequency magnetic field $B_1$ intensity orthogonal to the z-axis 318. For example, an orthogonal variation in the $B_1$ field intensity may be created to respond to a thickness variation in a subject being imaged. The gradient component may be implemented by electronically controllable unit cells within a group of the at least two groups 620. In an embodiment, the gradient component includes a gradient component in two respective directions orthogonal to the z-axis. In an embodiment, the system 602 includes a unit cell controller (not shown) configured to electronically control the at least two electronically controllable, artificially structured electromagnetic unit cells 624 of each group of the at least two groups 620 in response to the gradient component of the control signal.

In an embodiment, the at least two artificially structured electromagnetic unit cells 624 of each group of the at least two groups 620 include a single layer of at least two artificially structured electromagnetic unit cells configured to generate a magnetic field component orthogonal to the z-axis. In an embodiment, the at least two artificially structured electromagnetic unit cells of each group of the at least two groups include a first layer of at least two artificially structured electromagnetic unit cells and a second layer of at least two artificially structured electromagnetic unit cells, the unit cells of the first layer configured to generate a magnetic field component orthogonal to the z-axis, and the unit cells of the second layer configured to generate a magnetic field component orthogonal to the magnetic field component of the first layer of unit cells. In an embodiment, the at least two artificially structured electromagnetic unit cells of each group of the at least two groups includes a first layer of at least two artificially structured electromagnetic unit cells, a second layer of at least two artificially structured electromagnetic unit cells, and a third layer of at least two artificially structured electromagnetic unit cells, the three layers of unit cells in combination configured to generate magnetic field components in all three mutually orthogonal orientations.

In an embodiment, the at least two artificially structured electromagnetic unit cells 624 of each group of the at least two groups 620 include a single layer of the at least two artificially structured electromagnetic unit cells that in combination are configured to generate a radiofrequency magnetic field $B_1$ in two orthogonal directions. In an embodiment, the at least two artificially structured electromagnetic unit cells of each group of the at least two groups include a single layer of the at least two artificially structured electromagnetic unit cells that in combination are configured to generate a radiofrequency magnetic field $B_1$ in all three mutually orthogonal orientations.

FIG. 8 illustrates an example operational flow 800. After a start operation, the operational flow includes a reception operation 810. The reception operation includes receiving a pulse of radiofrequency electromagnetic waves from a radiofrequency signal generator or signal synthesizer component of a magnetic resonant imaging or a nuclear magnetic resonant device. In an embodiment, the reception operation may be implemented using the radiofrequency electromagnetic wave conducting structure 680 to receive the pulse 692 as described in conjunction with FIG. 6. A localization operation 820 includes generating a $B_1$ localization control signal defining a respective distribution of the pulse of radiofrequency electromagnetic waves to each group of the at least two selectable groups of at least two artificially structured electromagnetic unit cells. Each group of the at least two selectable groups configured to be respectively linearly arranged with respect to a z-axis of a bore of the magnetic resonant imaging or the nuclear magnetic resonant device. The respective power distribution collectively defining a pulse of radiofrequency magnetic field $B_1$ localized to a selected arbitrary examination segment transverse to the z-axis and within an examination region of the bore. In an embodiment, the localization operation may be implemented using the controller 672 described in conjunction with FIG. 6. A dissemination operation 830 includes distributing the received pulse of radiofrequency electromagnetic waves as an incident pulse of radiofrequency electromagnetic waves to a group of the at least two selectable groups in accord with the $B_1$ localization control signal. In an embodiment, the dissemination operation may be implemented using the electromagnetic wave conducting structure 680, the electronically controllable switch 686, and the wave conducting sub-structure portions 682.1-682.5 described in conjunction with FIG. 6. A conversion operation 840 includes transforming, using the at least two artificially structured electromagnetic unit cells of the group, the incident pulse of radiofrequency electromagnetic waves into a localized pulse of a radiofrequency magnetic field $B_1$ orientated transverse to the selected arbitrary examination segment. The localized pulse having an intensity sufficient to excite a detectable magnetic resonance in magnetically active nuclei located within the selected arbitrary examination segment. In an embodiment, the conversion operation may be implemented by the at least two artificially structured electromagnetic unit cells 624 of a group of the at least two groups 620 described in conjunction with FIG. 6. The operational flow includes an end operation.

In an embodiment, the operational flow 800 may include at least one additional operation. The at least one additional operation may include selecting the arbitrary examination segment responsive to data indicative of a location of a slice along the z-axis a transverse selected for examination.

Figure 9:
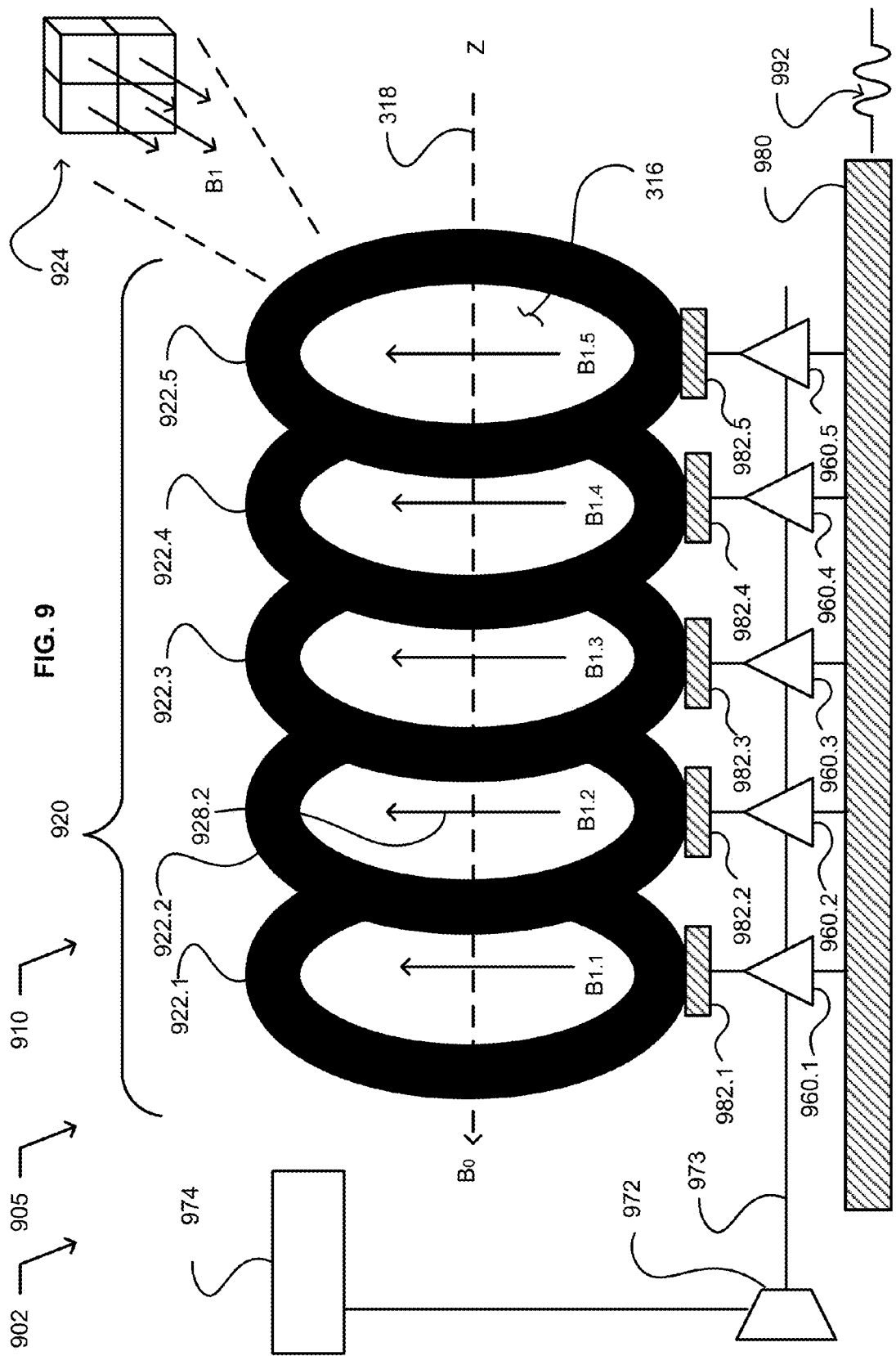
FIG. 9 illustrates a system 902 that includes an embodiment of an example apparatus 905 configured to generate a radiofrequency magnetic field $B_1$.

FIG. 9 illustrates a system 902 that includes an embodiment of an example apparatus 905 configured to generate a radiofrequency magnetic field $B_1$ in a magnetic resonant imaging or a nuclear magnetic resonant device, for example, such as the magnetic resonant imaging or a nuclear magnetic resonant device described in conjunction with the environment 200 in FIG. 1. The system includes an array 910 of at least two groups 920 of at least two artificially structured electromagnetic unit cells 924. Each group of the at least two groups is configured to be sequentially positioned in a respective plane transverse to the z-axis 318 of the bore 316 of a magnetic resonant imaging or a nuclear magnetic resonant device. Each group of at least two groups includes a respective electronically controllable, radiofrequency amplifier 960 (illustrated by amplifiers 960.1-960.5) switchable between an off-state and an on-state in response to a received $B_1$ localization control signal 973, and configured in the on-state to pass-through or amplify a received pulse of radiofrequency electromagnetic waves 992. For example, the electronically controllable, radiofrequency amplifier associated with a group 922.1 is illustrated by an electronically controllable, radiofrequency amplifier 960.1 coupled between a primary radiofrequency electromagnetic wave conducting structure 980 and a secondary radiofrequency electromagnetic wave conducting structure 982.1. The electronically controllable, radiofrequency amplifiers associated with groups 922.2-922.5 are similarly illustrated in FIG. 9. Each group of at least two groups includes a respective secondary radiofrequency electromagnetic wave conducting structure configured to deliver an amplified pulse of radiofrequency electromagnetic waves to the at least two artificially structured electromagnetic unit cells of the group as an incident amplified pulse of radiofrequency electromagnetic waves. The respective secondary radiofrequency electromagnetic wave conducting structures are schematically illustrated as secondary radiofrequency electromagnetic wave conducting structures 982.1-982.5. In an embodiment, the respective secondary radiofrequency electromagnetic wave conducting structures will form structures wrapping each group of the at least two groups.

The at least two artificially structured electromagnetic unit cells 924 of each group of the at least two groups 920 are respectively configured to transform the delivered incident amplified pulse of radiofrequency electromagnetic waves into a pulse of radiofrequency magnetic field $B_1$ orientated transverse to a segment of the z-axis 318 (hereafter "transverse segment") and spatially proximate to the group. The at least two artificially structured electromagnetic unit cells 924 are illustrated as a 2×2 arrangement of artificially structured electromagnetic unit cells. In an embodiment for example, a group of the at least two artificially structured electromagnetic unit cells 924 may include an arrangement of unit cells of hundreds or thousands of unit cells in a circumference of the group, and tens or hundreds of unit cells over a width of the group. The artificial structure of unit cells, including inclusions, may be selected or designed by one skilled in the art responsive to the particular design requirements and materials available. For example, FIG. 3 and accompanying description illustrate several artificial structures of unit cells.

The system 905 includes a control circuit 972 configured to select an arbitrary examination segment transverse to the z-axis 318 in response to data indicative of a transverse slice selected for examination. The control circuit is configured to generate the $B_1$ localization control signal 673 defining an amplification state assigned to each group of the at least two groups 920. The amplification states collectively defining a pulse of radiofrequency magnetic field $B_1$ localized to the selected arbitrary examination segment and having magnetic field intensity sufficient to excite a detectable magnetic resonance in magnetically active nuclei located within the selected arbitrary examination segment.

In an embodiment of the system 905, each radiofrequency amplifier 960 of each group of the at least two groups 920 is electronically switchable between an on-state and off-state. In an embodiment, each radiofrequency amplifier of each group of the at least two groups includes an electronically controllable variable gain amplifier. In an embodiment, the $B_1$ control signal 973 includes an amplification parameter assigned to a group of the at least two groups. In an embodiment, each group of the at least two groups includes an electronically controllable radiofrequency amplifier and an electronically controllable phase shifter or variable phase delay lines. In an embodiment, the pulse of radiofrequency electromagnetic waves 992 is received from a radiofrequency signal generator or synthesizer component of the magnetic resonant imaging or a nuclear magnetic resonant device 300. In an embodiment, the data includes data indicative of a location along the z-axis 318 of the transverse slice selected for examination. In an embodiment, the defined pulse of radiofrequency magnetic field $B_1$ localized to the selected arbitrary examination segment includes a magnetic field having intensity sufficient to excite a detectable magnetic resonance in magnetically active nuclei located within the selected arbitrary segment.

In an embodiment, the amplification states collectively define an optimized pulse of the radiofrequency magnetic field $B_1$ localized to the selected arbitrary examination segment. In an embodiment, the optimized pulse is selected responsive to a set of configurable rules. In an embodiment, the optimized pulse is selected responsive to a matrix factorization, or a matrix decomposition based optimization technique. In an embodiment, the optimized pulse includes a pulse of radiofrequency magnetic field $B_1$ localized to the selected arbitrary examination segment and having a magnetic field intensity sufficient to excite a detectable magnetic resonance in magnetically active nuclei located within the selected arbitrary examination segment. The optimized pulse is subject to a constraint limiting the electric field intensity within the selected arbitrary examination segment to less than a preselected value.

In an embodiment of the system 905, the localized pulse of the radiofrequency magnetic field $B_1$ includes a first electric field intensity in the selected arbitrary examination segment and includes a second electric field intensity in another arbitrary transverse segment of the examination region. The second electric field intensity is less than the first electric field intensity. In an embodiment, the other arbitrary transverse segment abuts the selected arbitrary examination segment.

In an embodiment of the system 905, the localized pulse of the radiofrequency magnetic field $B_1$ includes (i) a first radiofrequency electric field intensity in the selected arbitrary examination segment, (ii) a second radiofrequency electric field intensity in a second arbitrary transverse segment of the examination region abutting the selected arbitrary transverse segment, and (iii) a third radiofrequency electric field intensity in a third arbitrary transverse segment of the examination region abutting the selected arbitrary transverse segment and positioned opposite to the second arbitrary transverse segment. In this embodiment, the second and third radiofrequency electric field intensities are each less than the first radiofrequency electric field intensity.

In an embodiment of the system 905, the localized pulse of the radiofrequency magnetic field $B_1$ is configured to produce a first specific absorption rate (SAR) in a potential examination subject located in the selected arbitrary examination segment and to produce a second SAR in another arbitrary transverse segment of the examination region. In this embodiment, the second SAR is less than the first SAR. SAR typically is expressed as watts per kilogram.

In an embodiment of the system 905, a possible amplification state includes an on-state or an off-state. In an embodiment, the amplification state includes an off-state for at least one of the three groups 920. In an embodiment, the $B_1$ localization control signal defines an amplification state and an amplification parameter assigned to each group of the at least two groups. In an embodiment, the $B_1$ localization control signal defines a respective power distribution and phase delays (including zero and non-zero phase delays) of a particular incident pulse of radiofrequency electromagnetic waves to each group of the at least two groups. In an embodiment, the amplification parameter includes an amplitude or a phase assigned to each group of the at least two groups.

In an embodiment of the system 905, the control circuit 972 includes a control circuit configured to (i) select an arbitrary examination segment transverse to the z-axis 318 responsive to data indicative of a transverse slice selected for examination, (ii) select at least one group of the at least two groups 920 to deliver a localized pulse of radiofrequency magnetic field $B_1$ to the selected arbitrary examination segment, (iii) define a pulse of radiofrequency magnetic field $B_1$ localized to the selected arbitrary examination segment and having a magnetic field intensity sufficient to excite a detectable magnetic resonance in magnetically active nuclei located within the selected arbitrary segment, and in response thereto (iv) generate the $B_1$ localization control signal defining an amplification state assigned to each group of the at least two groups. In an embodiment, the (iii) define includes define an optimized pulse of radiofrequency magnetic field $B_1$ localized to the selected arbitrary examination segment.

In an embodiment of the system 905, the first group of the at least two groups 920 includes a first group of at least two artificially structured unit electromagnetic cells 924 configured to generate a magnetic field-dominant radiofrequency near-field whose magnetic and electric field intensities are such that $(B_1c)/E_1>1$, and a second group of the at least two groups includes at least two artificially structured unit electromagnetic cells configured to generate an electric field counteracting a non-vanishing electric field generated by the first group of artificially structured electromagnetic unit cells.

In an embodiment, the system 905 includes a receiver 974 configured to receive data indicative of a location along the z-axis 318 of the transverse slice selected for examination. In an embodiment, the control circuit 972 is configured to select the arbitrary examination segment responsive to the data indicative of the location of the slice along the z-axis.

In an embodiment of the system 905, the at least two artificially structured electromagnetic unit cells of each group include at least two assemblages of artificially structured electromagnetic unit cells 1215 as described in conjunction with FIG. 12. In this embodiment, each assemblage of at least two artificially structured electromagnetic unit cells includes a first artificially structured electromagnetic unit cell 1222 configured to generate the pulse of the radiofrequency magnetic field $B_1$ and a second artificially structured electromagnetic unit cell 1224 configured to generate an electric field E counteracting a non-vanishing electric field component generated by the first artificially structured electromagnetic unit cell.

In an embodiment of the system 905, the generated $B_1$ localization control signal defines an amplification state and a phase assigned to each the at least two artificially structured electromagnetic unit cells of each assemblage of the at least two assemblages of each group. The defined amplification states and phases collectively defining an optimized pulse of the radiofrequency magnetic field $B_1$ localized to the selected arbitrary examination segment and having a selected E/(Bc) ratio averaged over the selected arbitrary examination segment. In an embodiment, the selected E/(Bc) ratio includes a minimized E/(Bc) ratio averaged over the selected arbitrary examination segment. In an embodiment, the selected E/(Bc) ratio includes an optimized E/(Bc) ratio averaged over the selected arbitrary examination segment. In an embodiment, the optimized E/(Bc) ratio is selected responsive to a set of configurable rules. In an embodiment, the optimized E/(Bc) ratio is selected responsive to a matrix factorization, or a matrix decomposition based optimization technique.

In an embodiment of the system 905, the at least two artificially structured electromagnetic unit cells 924 include at least two electrically-controllable, artificially structured electromagnetic unit cells. In an embodiment, the at least two artificially structured electromagnetic unit cells of a group include at least two randomly accessible, electrically-controllable, artificially structured electromagnetic unit cells. In an embodiment, the at least two electrically-controllable, artificially structured electromagnetic unit cells are configured to generate a gradient in the radiofrequency magnetic field $B_1$ intensity across the selected transverse segment.

FIG. 10 illustrates an example operational flow 1000. After a start operation, the operational flow includes reception operation 1010. The reception operation includes receiving a pulse of radiofrequency electromagnetic waves from a radiofrequency signal generator or signal synthesizer component of a magnetic resonant imaging or a nuclear magnetic resonant device. In an embodiment, the reception operation may be implemented using the primary radiofrequency electromagnetic wave conducting structure 980 to receive the pulse of radiofrequency electromagnetic waves 992 as described in conjunction with FIG. 9. A choice operation 1020 includes selecting an arbitrary examination segment transverse to a z-axis of a bore of the magnetic resonant imaging or the nuclear magnetic resonant device in response to data indicative of a location of a transverse slice selected for examination. In an embodiment, the choice operation may be implemented using the controller 973 described in conjunction with FIG. 9. A localization operation 1030 includes generating a $B_1$ localization control signal defining an amplification state assigned to each group of at least two groups of at least two artificially structured electromagnetic unit cells. Each group of the at least two groups of the array is sequentially positioned in a respective plane transverse to the z-axis. The amplification states collectively defining a localized pulse of radiofrequency magnetic field $B_1$ transverse to the quasistatic magnetic field $B_0$ that is parallel to the z-axis of the bore. The localized pulse having an intensity sufficient to excite a detectable magnetic resonance in magnetically active nuclei located within the selected arbitrary examination segment. In an embodiment, the localization operation may be implemented using the controller 972 described in conjunction with FIG. 9. A regulation operation 1040 includes switching an electronically controllable radiofrequency amplifier of a group of at least two groups to a state responsive to the $B_1$ localization control signal and respectively amplifying the received pulse of radiofrequency electromagnetic waves in response thereto. For example, the amplifier may be placed in an on-state, an off-state, or to a selected amplification level state. In an embodiment, the regulation operation may be implemented by using the control signal 973 to switch on at least one of the amplifiers 960.1-960.5 described in conjunction with FIG. 9. A dissemination operation 1050 includes delivering the amplified received pulse of radiofrequency electromagnetic waves as an incident amplified pulse of radiofrequency electromagnetic waves to the at least two artificially structured electromagnetic unit cells of the group. In an embodiment, the dissemination operation may be implemented using at least one of the secondary radiofrequency electromagnetic wave conducting structure 982.1-982.5 described in conjunction with FIG. 9. A conversion operation 1060 includes transforming, using the at least two artificially structured electromagnetic unit cells of the group of at least two groups, the incident amplified pulse of radiofrequency electromagnetic waves into the localized pulse of radiofrequency magnetic field $B_1$. The conversion operation may be implemented using the at least two artificially structured electromagnetic unit cells 924 of the group of at least two groups 920 described in conjunction with FIG. 9. The operational flow includes an end operation. In an embodiment, the operational flow includes receiving the data indicative of the location of the transverse slice selected for examination.

Figure 11:
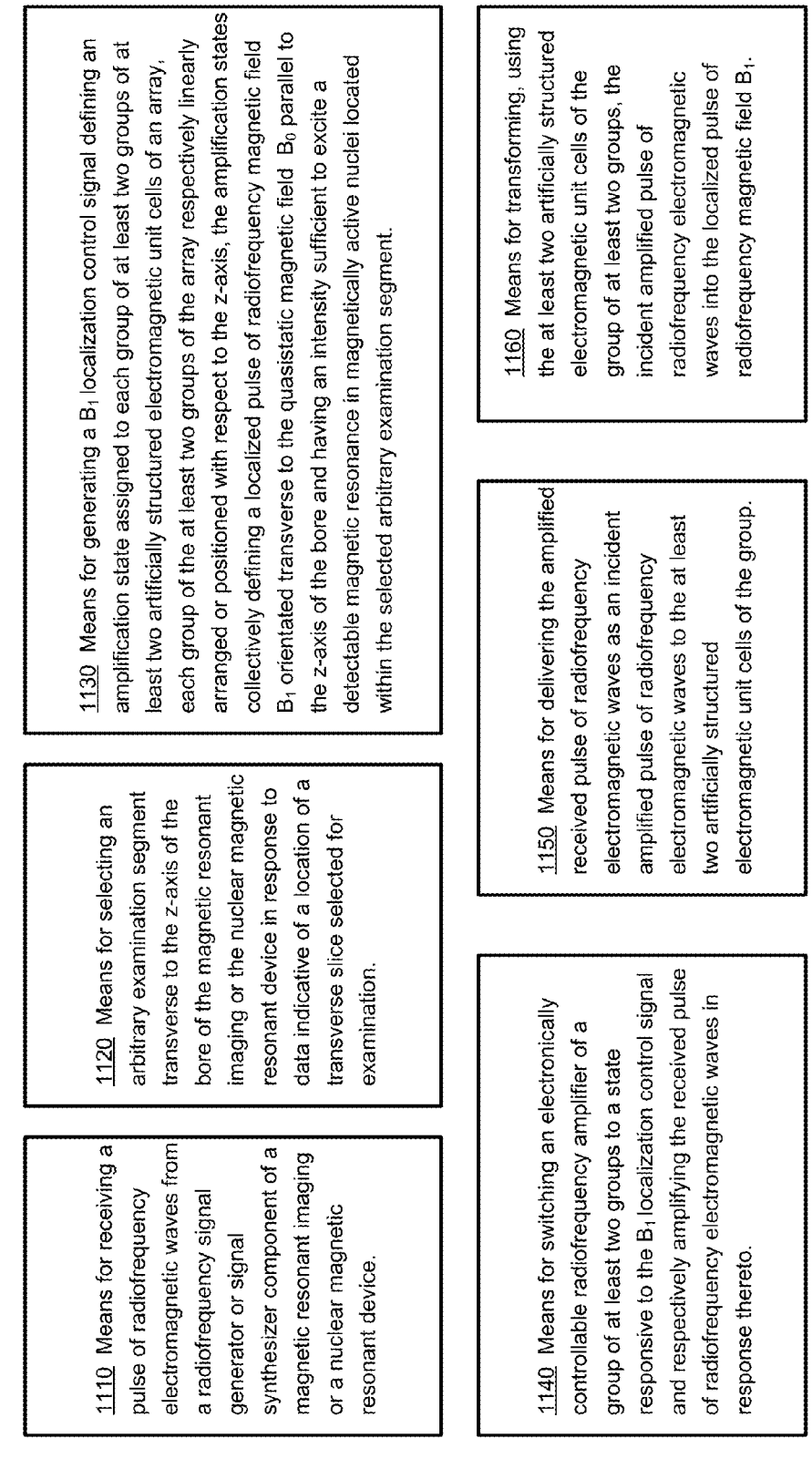
FIG. 11 illustrates an example apparatus 1100.

FIG. 11 illustrates an example apparatus 1100. The apparatus includes means 1110 for receiving a pulse of radiofrequency electromagnetic waves from a radiofrequency signal generator or signal synthesizer component of a magnetic resonant imaging or a nuclear magnetic resonant device. The apparatus includes means 1120 for selecting an arbitrary examination segment transverse to the z-axis of the bore of the magnetic resonant imaging or the nuclear magnetic resonant device in response to data indicative of a location of a transverse slice selected for examination. The apparatus includes means 1130 for generating a $B_1$ localization control signal defining an amplification state assigned to each group of at least two groups of at least two artificially structured electromagnetic unit cells of an array. Each group of the at least two groups of the array is sequentially positioned in a respective plane transverse to the z-axis. The amplification states collectively defining a localized pulse of radiofrequency magnetic field $B_1$ orientated transverse to the quasistatic magnetic field $B_0$ parallel to the z-axis of the bore and having an intensity sufficient to excite a detectable magnetic resonance in magnetically active nuclei located within the selected arbitrary examination segment. The apparatus includes means 1140 for switching an electronically controllable radiofrequency amplifier of a group of at least two groups to a state responsive to the $B_1$ localization control signal and respectively amplifying the received pulse of radiofrequency electromagnetic waves in response thereto. The apparatus includes means 1150 for delivering the amplified received pulse of radiofrequency electromagnetic waves as an incident amplified pulse of radiofrequency electromagnetic waves to the at least two artificially structured electromagnetic unit cells of the group. The apparatus includes means 1160 for transforming, using the at least two artificially structured electromagnetic unit cells of the group of at least two groups, the incident amplified pulse of radiofrequency electromagnetic waves into the localized pulse of radiofrequency magnetic field $B_1$.

FIG. 12 illustrates an example an apparatus 1205. The apparatus including an assemblage 1215 of artificially structured electromagnetic unit cells 1220. The artificially structured electromagnetic unit cells include a first artificially structured electromagnetic unit cell configured to transform incident radiofrequency electromagnetic waves 1292 into a radiofrequency magnetic field $B_1$ perpendicular to the plane of the assemblage. The plane of the assemblage is illustrated as in the X-axis and Z-axis of the X-Y-Z axises 1292. The first artificially structured electromagnetic unit cell is illustrated by an artificially structured electromagnetic unit cell 1222.1. Another first artificially structured electromagnetic unit cell is illustrated by an artificially structured electromagnetic unit cell 1222.2. The artificially structured electromagnetic unit cells include a second artificially structured electromagnetic unit cell configured to transform another incident radiofrequency electromagnetic waves into an electric field E counteracting a non-vanishing electric field component generated by the first artificially structured electromagnetic unit cell. The second artificially structured electromagnetic unit cell is illustrated by an artificially structured electromagnetic unit cell 1224.1. Another second artificially structured electromagnetic unit cell is illustrated by an artificially structured electromagnetic unit cell 1224.2. In an embodiment, second artificially structured unit cell may be loaded with a lumped capacitor to lower its resonance frequency. In an embodiment, the incident radiofrequency electromagnetic waves 1292 include the another incident radiofrequency electromagnetic waves. In an embodiment, the another incident radiofrequency electromagnetic waves are different from the incident radiofrequency electromagnetic waves 1292.

In an embodiment, the assemblage 1215 includes a planar assemblage of the artificially structured electromagnetic unit cells 1220. In an embodiment, the assemblage includes an arcuate assemblage 1220 of artificially structured electromagnetic unit cells. In an embodiment, the array includes at least two assemblages of artificially structured electromagnetic unit cells. In an embodiment, the first artificially structured electromagnetic unit cell and the second artificially structured electromagnetic unit cell are respectively configured to produce a selected E/(Bc) ratio in the radiofrequency magnetic field B perpendicular to the plane of the assemblage. In an embodiment, the first artificially structured electromagnetic unit cell and the second artificially structured electromagnetic unit cell are respectively configured to produce a selected minimized E/(Bc) ratio in the radiofrequency magnetic field B perpendicular to the plane of the assemblage.

In an embodiment, the counteracting electric field E includes an offsetting electric field E. In an embodiment, the counteracting electric field E includes an electric field E at least partially cancelling a non-vanishing electric field component generated by the first artificially structured electromagnetic unit cell. In an embodiment, the non-vanishing electric field includes a non-vanishing electric field component generated by electric dipole or multipole moments by the first artificially structured electromagnetic unit.

In an embodiment, the second artificially structured electromagnetic unit cell (1224.1 or 1224.2) includes a one-dimensional or two-dimensional split ring resonator unit cell optimized for high electric field intensity. For example, the SRR may include an "H" shape with shoulder plates pointed centrally.

In an embodiment, each assemblage 1215 includes two first artificially structured electromagnetic unit cells 1222, and one second artificially structured electromagnetic unit cell 1224. In an embodiment, each assemblage includes two first artificially structured electromagnetic unit cells arranged in a first row, and two second artificially structured electromagnetic unit cells arranged in a second row. In an embodiment, each assemblage includes two first artificially structured electromagnetic unit cells arranged on a first diagonal, and two second artificially structured electromagnetic unit cell arranged on a second diagonal orthogonal to the first diagonal.

In an embodiment, the first artificially structured electromagnetic unit cell 1222 is configured to transform incident radiofrequency electromagnetic waves into a radiofrequency magnetic field $B_1$ having a first component perpendicular (Y-axis) to the plane of the planar array and a second component orthogonal (X-axis or Z-axis) to the plane (X-Z) of the planar array. In an embodiment, the first artificially structured electromagnetic unit cell is configured to transform incident radiofrequency electromagnetic waves into a radiofrequency magnetic field $B_1$ having components in all three mutually orthogonal directions. In an embodiment, the first artificially structured electromagnetic unit cell includes a pair of artificially structured electromagnetic units cells. A first cell of the pair is configured to transform incident radiofrequency electromagnetic waves into a radiofrequency magnetic field $B_1$ perpendicular to the plane of the planar array, and a second cell of the pair is configured to transform incident radiofrequency electromagnetic waves into a radiofrequency magnetic field $B_1$ orthogonal to the plane of the planar array. In an embodiment, the first artificially structured electromagnetic unit cell includes three artificially structured electromagnetic units cells configured to transform incident radiofrequency electromagnetic waves into a radiofrequency magnetic field B having components in all three mutually orthogonal directions.

In an embodiment, each assemblage 1215 of the artificially structured electromagnetic unit cells 1220 includes a first layer of artificially structured electromagnetic unit cells configured to transform incident radiofrequency electromagnetic waves into a radiofrequency magnetic field $B_1$ perpendicular or normal to the plane of the planar array. Each assemblage also includes a second layer of artificially structured electromagnetic unit cells configured to transform the incident pulse of radiofrequency electromagnetic waves into an electric field E counteracting a non-vanishing electric field component generated by the first layer of artificially structured electromagnetic unit cells.

In an embodiment, the apparatus 1205 includes a radiofrequency electromagnetic wave conducting structure 1280 configured to distribute the radiofrequency electromagnetic waves 1292 as incident radiofrequency electromagnetic waves to the assemblage 1215 of at least two groups 1120 of artificially structured electromagnetic unit cells 1220.

In an embodiment, the assemblage 1215 of artificially structured electromagnetic unit cells 1220 is capable of creating essentially any quasistatic field configuration compatible with Maxwell's equations. In an embodiment of the apparatus 1205, electric fields in the near-field may be sculpted almost independently from the magnetic fields. This is possible because of the weak coupling between magnetic and electric fields in the near-field. The ability to control or limit electric field intensity relatively independently of magnetic field intensity is useful in a variety of biomedical applications. For example, this will allow relatively strong magnetic fields to be directed at patients while an electric field normally associated with the strong magnetic field is significantly reduced, thus improving patient safety and comfort. For example, this will allow the use of higher-intensity magnetic fields capable of providing better quality images or faster image acquisition rates, without increasing the patient's discomfort or exceeding the maximum permissible exposure to the electric fields or maximum safe SAR levels. For example, applications of the assemblage include non-invasive wireless charging of or communication with surgical microbots whose size limits or prohibits an on-board battery. For example, applications of the assemblage include magnetic induction tomography (MIT), magneto-acoustic tomography (MAT) (also known as magneto-inductive ultrasonography), or transcranial magnetic stimulation (TMS). For example, applications of the assemblage include using the same apparatus to perform several actions on a patient. For example, a single apparatus may perform MRI-guided TMS, or MAT-guided micro-robot or nano-robot-assisted surgery.

FIG. 12 also illustrates an alternative embodiment of the example apparatus 1205. The apparatus includes an array 1210 of at least two assemblages 1215 of the at least two artificially structured electromagnetic unit cells 1220. Each assemblage of the at least two assemblage of artificially structured electromagnetic unit cells including a first artificially structured electromagnetic unit cell 1222 configured to transform incident radiofrequency electromagnetic waves into a radiofrequency magnetic field $B_1$ perpendicular to the plane of the assemblage. Each assemblage of the at least two assemblage of artificially structured electromagnetic unit cells including a second artificially structured electromagnetic unit cell 1224 configured to transform the incident radiofrequency electromagnetic waves into an electric field E counteracting a non-vanishing electric field component generated by the first artificially structured electromagnetic unit cell. For example the array 1210 may be at least similar to the array 610 of at least two groups 620 described in conjunction with FIG. 6, wherein each group include a respective assemblage of the artificially structured electromagnetic unit cells 1220. For example the array 1210 may be at least similar to the array 910 of at least two groups 920 described in conjunction with FIG. 9, wherein each group include a respective assemblage of the artificially structured electromagnetic unit cells 1220.

The apparatus 1205 includes a radiofrequency electromagnetic wave conducting structure 1280 configured to distribute the radiofrequency electromagnetic waves 1292 as incident radiofrequency electromagnetic waves to each assemblage of the at least two assemblages of artificially structured electromagnetic unit cells 1220. In an embodiment, the array 1210 includes a planar or an arcuate array of the at least two assemblages 1215 of artificially structured electromagnetic unit cells 1220.

Figure 13:
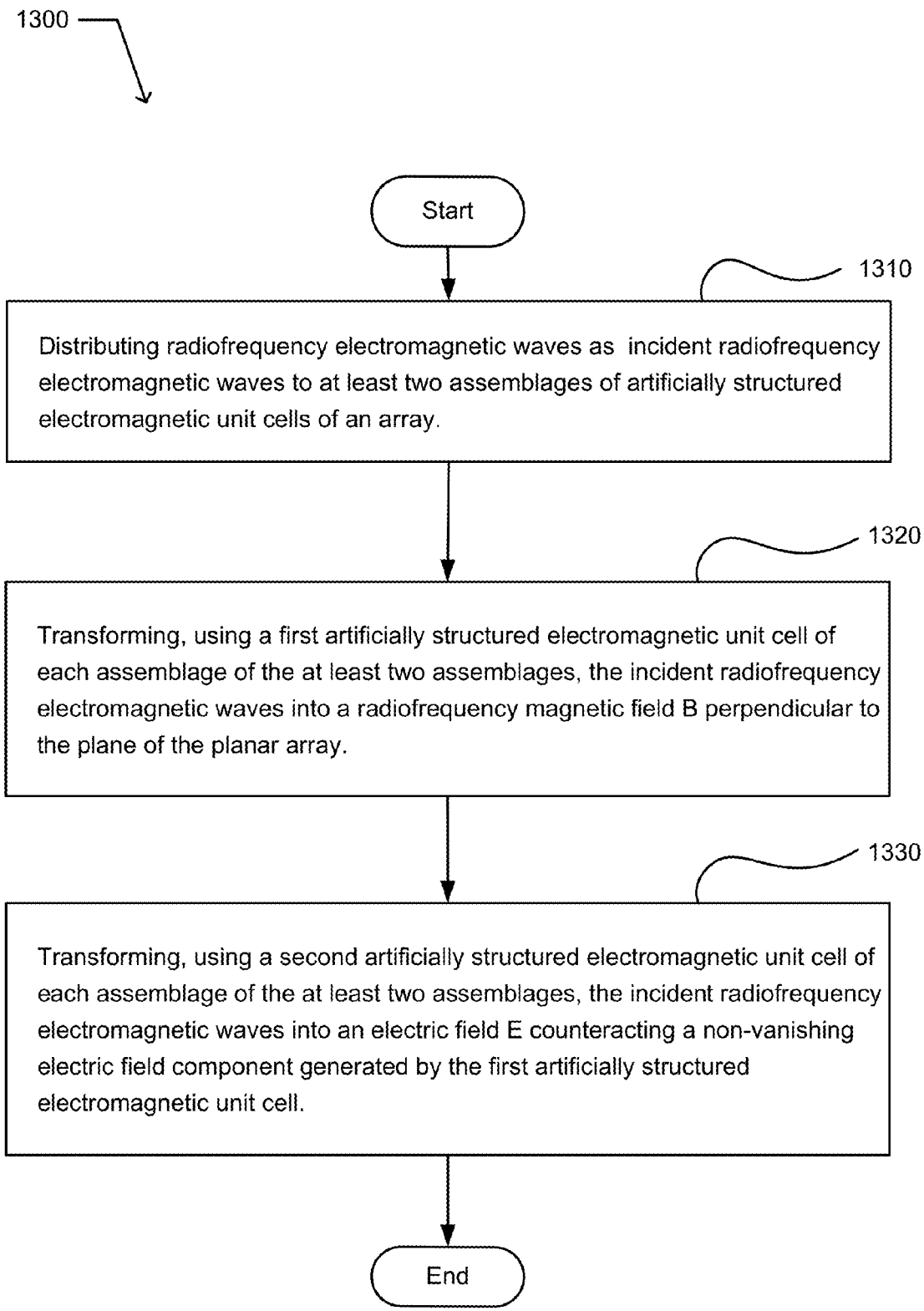
FIG. 13 illustrates an example operational flow 1300.

FIG. 13 illustrates an example operational flow 1300. After a start operation, the operational flow includes dissemination operation 1310. The dissemination operation includes distributing radiofrequency electromagnetic waves as incident radiofrequency electromagnetic waves to at least two assemblages of artificially structured electromagnetic unit cells of an array. In an embodiment, the dissemination operation may be implemented using the radiofrequency electromagnetic wave conducting structure 1280 as described in conjunction with FIG. 12. A first conversion operation 1320 includes transforming, using a first artificially structured electromagnetic unit cell of each assemblage of the at least two assemblages, the incident radiofrequency electromagnetic waves into a radiofrequency magnetic field B perpendicular to the plane of the planar array. In an embodiment, the first conversion operation may be implemented using the first artificially structured electromagnetic unit cell described in conjunction with FIG. 12, such as the first unit cell 1222.1. A second conversion operation 1330 includes transforming, using a second artificially structured electromagnetic unit cell of each assemblage of the at least two assemblages, the incident radiofrequency electromagnetic waves into an electric field E counteracting a non-vanishing electric field component generated by the first artificially structured electromagnetic unit cell. In an embodiment, the first conversion operation may be implemented using the second artificially structured electromagnetic unit cell described in conjunction with FIG. 12, such as the first unit cell 1224.1. The operational flow includes an end operation.

FIGS. 2 and 12 illustrate an alternative embodiment of the example apparatus 310. The apparatus includes the array 1210 of at least two assemblages 1215 of artificially structured electromagnetic unit cells 1220. Each assemblage is configured to generate a pulse of radiofrequency magnetic field $B_1$ 328 orientated transverse to the z-axis 318 of the bore 316 of a magnetic resonant imaging or a nuclear magnetic resonant device 300. Each assemblage of artificially structured electromagnetic unit cells including (i) a first artificially structured electromagnetic unit cell 1222 configured to transform an incident pulse of radiofrequency electromagnetic waves into the pulse of the radiofrequency magnetic field $B_1$ and (ii) a second artificially structured electromagnetic unit cell 1224 configured to transform the incident pulse of radiofrequency electromagnetic waves into an electric field E counteracting a component of a non-vanishing electric field generated by the first artificially structured electromagnetic unit cell. The pulse of the radiofrequency magnetic field $B_1$ collectively generated by the first artificially structured electromagnetic unit cell having a magnetic field intensity sufficient to excite a magnetic resonance in magnetically active nuclei located within the bore.

The apparatus 310 includes the radiofrequency electromagnetic wave conducting structure 380 configured to distribute the pulse of radiofrequency electromagnetic waves 392 as an incident pulse of radiofrequency electromagnetic waves to each of the at least two assemblages of artificially structured electromagnetic unit cells.

In an embodiment, the array 1215 is configured to generate a pulse of radiofrequency magnetic field $B_1$ orientated transverse to the quasistatic magnetic field $B_0$ parallel to the z-axis of the bore of a magnetic resonant imaging or a nuclear magnetic resonant device.

FIG. 14 illustrates an example operational flow 1400. After a start operation, the operational flow includes a reception operation 1410. The reception operation includes receiving a pulse of radiofrequency electromagnetic waves from a radiofrequency signal generator or synthesizer component of a magnetic resonant imaging or a nuclear magnetic resonant device. In an embodiment, the reception operation may be implemented using the radiofrequency electromagnetic wave conducting structure 380 described in conjunction with FIG. 2. A dissemination operation 1420 includes distributing the received pulse of radiofrequency electromagnetic waves as an incident pulse of radiofrequency electromagnetic waves to at least two assemblages of artificially structured electromagnetic unit cells. In an embodiment, the dissemination operation may be implemented using the radiofrequency electromagnetic wave conducting structure 380 or 1280 to distribute the pulse 1292 to at least two assemblages of artificially structured electromagnetic unit cells 1220 of the array 1220 described in conjunction with FIG. 12. A first conversion operation 1430 includes transforming, using a first artificially structured electromagnetic unit cell of each assemblage of the at least two assemblages, the incident pulse of radiofrequency electromagnetic waves into a pulse of a radiofrequency magnetic field $B_1$ orientated transverse the z-axis of to the bore of the magnetic resonant imaging or the nuclear magnetic resonant device. In an embodiment, the first conversion operation may be implemented using the first artificially structured electromagnetic unit cell described in conjunction with FIG. 12, such as the first unit cell 1222.1. A second conversion operation 1440 includes transforming, using a second artificially structured electromagnetic unit cell of each assemblage of the at least two assemblages, the incident radiofrequency electromagnetic waves into an electric field E counteracting a non-vanishing electric field component generated by the first artificially structured electromagnetic unit cell. In an embodiment, the first conversion operation may be implemented using the second artificially structured electromagnetic unit cell described in conjunction with FIG. 12, such as the first unit cell 1224.1. The pulse of radiofrequency magnetic field $B_1$ collectively generated by the artificially structured electromagnetic unit cells having a magnetic field intensity sufficient to excite a magnetic resonance in magnetically active nuclei located within at least a portion of an examination region located within the bore. The operational flow includes an end operation.

In an embodiment, the first conversion operation 1430 includes transforming, using a first artificially structured electromagnetic unit cell of an assemblage of the at least two assemblages, the incident pulse of radiofrequency electromagnetic waves into a pulse of a radiofrequency magnetic field $B_1$ orientated transverse to a segment of the quasistatic magnetic field $B_0$ parallel to the z-axis and spatially proximate to the group.

FIGS. 8 and 12 illustrate an alternative embodiment of the example system 602 that includes an alternative embodiment of the example apparatus 605 configured to generate a radiofrequency magnetic field $B_1$ in a magnetic resonant imaging or a nuclear magnetic resonant device, for example, such as the magnetic resonant imaging or a nuclear magnetic resonant device described in conjunction with the environment 200 in FIG. 1. The system includes an array 1210 of at least two assemblages 1215 of artificially structured electromagnetic unit cells 1220. Each assemblage of the at least two assemblages is configured to be sequentially positioned in a respective plane transverse to the z-axis 318 of the bore 316 of a magnetic resonant imaging or a nuclear magnetic resonant device. The artificially structured electromagnetic unit cells include a first artificially structured electromagnetic unit cell configured to transform an incident pulse of radiofrequency electromagnetic waves 1292 into a radiofrequency magnetic field B perpendicular to the plane of the assemblage. The first artificially structured electromagnetic unit cell is illustrated by an artificially structured electromagnetic unit cell 1222.1. Another first artificially structured electromagnetic unit cell is illustrated by an artificially structured electromagnetic unit cell 1222.2. The artificially structured electromagnetic unit cells include a second artificially structured electromagnetic unit cell configured to transform the incident pulse radiofrequency electromagnetic waves into an electric field E counteracting a non-vanishing electric field component generated by the first artificially structured electromagnetic unit cell. The second artificially structured electromagnetic unit cell is illustrated by an artificially structured electromagnetic unit cell 1224.1. Another second artificially structured electromagnetic unit cell is illustrated by an artificially structured electromagnetic unit cell 1224.2.

The system 602 includes the radiofrequency electromagnetic wave conducting structure 1280 configured to distribute the pulse of radiofrequency electromagnetic waves 1292 as incident radiofrequency electromagnetic waves to a selectable assemblage of the at least two assemblages in response to a $B_1$ localization control signal 673. The system includes a control circuit 672 configured to generate the $B_1$ localization control signal defining a respective power distribution of a particular incident pulse of radiofrequency electromagnetic waves to each assemblage of the at least two assemblages. The respective power distribution collectively defining a particular pulse of radiofrequency magnetic field $B_1$ localized to a selected arbitrary examination segment transverse to the z-axis 318 and within an examination region of the bore 316. The localized magnetic field $B_1$ having an intensity sufficient to excite a detectable magnetic resonance in magnetically active nuclei located within the selected arbitrary examination segment.

FIG. 15 illustrates an example operational flow 1500. After a start operation, the operational flow includes a reception operation 1510. The reception operation includes receiving a pulse of radiofrequency electromagnetic waves from a radiofrequency signal generator or synthesizer component of a magnetic resonant imaging or a nuclear magnetic resonant device. A dissemination operation 1520 includes the received pulse of radiofrequency electromagnetic waves as an incident pulse of radiofrequency electromagnetic waves to a selected assemblage of at least two artificially structured electromagnetic unit cells of at least two assemblages of artificially structured electromagnetic unit cells. A first conversion operation 1530 includes transforming, using a first artificially structured electromagnetic unit cell of the selected assemblage, the incident pulse of radiofrequency electromagnetic waves into a localized pulse of a radiofrequency magnetic field $B_1$ orientated transverse to a segment of the quasistatic magnetic field $B_0$ parallel to the z-axis of a bore of the magnetic resonant imaging or the nuclear magnetic resonant device, the localized pulse of the radiofrequency magnetic field $B_1$ having a magnetic field intensity sufficient to excite a detectable magnetic resonance in magnetically active nuclei located within at least a portion of the transverse segment. The localized pulse of the radiofrequency magnetic field $B_1$ having a magnetic field intensity sufficient to excite a detectable magnetic resonance in magnetically active nuclei located within at least a portion of the transverse segment. A second conversion operation 1540 includes transforming, using a second artificially structured electromagnetic unit cell of each assemblage of the at least two assemblages, the incident pulse of radiofrequency electromagnetic waves into an electric field E counteracting a component of a non-vanishing electric field generated by the first artificially structured electromagnetic unit cell of each assemblage of the at least two assemblages. The operational flow includes an end operation.

FIGS. 9 and 12 illustrate an alternative embodiment of the example system 902 that includes an alternative embodiment of the example apparatus 905 configured to generate a radiofrequency magnetic field $B_1$ in a magnetic resonant imaging or a nuclear magnetic resonant device, for example, such as the magnetic resonant imaging or a nuclear magnetic resonant device described in conjunction with the environment 200 in FIG. 1. The system includes an array 1210 of the at least two groups 920. Each group of the at least two groups includes at least two assemblages 1215 of the artificially structured electromagnetic unit cells 1220. Each group of the at least two groups is configured to be sequentially positioned in a respective plane transverse to the z-axis 315 of the bore 316 of a magnetic resonant imaging or a nuclear magnetic resonant device. Each group of at least two groups includes an electronically controllable radiofrequency amplifier 960 configured to amplify the received pulse of radiofrequency electromagnetic waves 992 in response to a $B_1$ localization control signal 973. Each group of at least two groups includes a radiofrequency electromagnetic wave conducting structure 982 configured to deliver the amplified pulse of radiofrequency electromagnetic waves as incident amplified pulse of radiofrequency electromagnetic waves to the at least two assemblages of artificially structured electromagnetic unit cells of the group. Each assemblage of the artificially structured electromagnetic unit cells including (i) a first artificially structured electromagnetic unit cell 1222 configured to transform incident amplified pulse of radiofrequency electromagnetic waves into a pulse of radiofrequency magnetic field $B_1$ transverse to a segment of the z-axis and spatially proximate to the group and (ii) a second artificially structured electromagnetic unit cell 1224 configured to transform incident amplified radiofrequency electromagnetic waves into an electric field counteracting a non-vanishing electric field component generated by the first artificially structured electromagnetic unit cell.

The system 902 includes the control circuit 972 configured to select an arbitrary examination segment transverse to the quasistatic magnetic field $B_0$ parallel to the z-axis 318 in response to data indicative of a transverse slice selected for examination. The control circuit is configured to generate the $B_1$ localization control signal 973 defining an amplification state assigned to each amplifier 960. The amplification states collectively defining a pulse of radiofrequency magnetic field $B_1$ localized to the selected arbitrary examination segment and having a magnetic field intensity sufficient to excite a detectable magnetic resonance in magnetically active nuclei located within at least a portion of the transverse segment.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof.

All references cited herein are hereby incorporated by reference in their entirety or to the extent their subject matter is not otherwise inconsistent herewith.

In some embodiments, "configured" includes at least one of designed, set up, shaped, implemented, constructed, or adapted for at least one of a particular purpose, application, or function.

It will be understood that, in general, terms used herein, and especially in the appended claims, are generally intended as "open" terms. For example, the term "including" should be interpreted as "including but not limited to." For example, the term "having" should be interpreted as "having at least." For example, the term "has" should be interpreted as "having at least." For example, the term "includes" should be interpreted as "includes but is not limited to," etc. It will be further understood that if a specific number of an introduced claim recitation is intended, such an intent will be explicitly recited in the claim, and in the absence of such recitation no such intent is present. For example, as an aid to understanding, the following appended claims may contain usage of introductory phrases such as "at least one" or "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a receiver" should typically be interpreted to mean "at least one receiver"); the same holds true for the use of definite articles used to introduce claim recitations. In addition, even if a specific number of an introduced claim recitation is explicitly recited, it will be recognized that such recitation should typically be interpreted to mean at least the recited number (e.g., the bare recitation of "at least two chambers," or "a plurality of chambers," without other modifiers, typically means at least two chambers).

In those instances where a phrase such as "at least one of A, B, and C," "at least one of A, B, or C," or "an [item] selected from the group consisting of A, B, and C," is used, in general such a construction is intended to be disjunctive (e.g., any of these phrases would include but not be limited to systems that have A alone, B alone, C alone, A and B together, A and C together, B and C together, or A, B, and C together, and may further include more than one of A, B, or C, such as $A_1$, $A_2$, and C together, A, $B_1$, $B_2$, $C_1$, and $C_2$ together, or $B_1$ and $B_2$ together). It will be further understood that virtually any disjunctive word or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The herein described aspects depict different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality. Any two components capable of being so associated can also be viewed as being "operably couplable" to each other to achieve the desired functionality. Specific examples of operably couplable include but are not limited to physically mateable or physically interacting components or wirelessly interactable or wirelessly interacting components.

With respect to the appended claims the recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Use of "Start," "End," "Stop," or the like blocks in the block diagrams is not intended to indicate a limitation on the beginning or end of any operations or functions in the diagram. Such flowcharts or diagrams may be incorporated into other flowcharts or diagrams where additional functions are performed before or after the functions shown in the diagrams of this application. Furthermore, terms like "responsive to," "related to," or other past-tense adjectives are generally not intended to exclude such variants, unless context dictates otherwise.

While various aspects and embodiments have been disclosed herein, other aspects and embodiments will be apparent to one skilled in the art. The various aspects and embodiments disclosed herein are for purposes of illustration and are not intended to be limiting, with the true scope and spirit being indicated by the following claims.

What is claimed is:

1. An apparatus comprising:
   a radiofrequency electromagnetic wave conducting structure configured to selectively distribute a received pulse of radiofrequency electromagnetic waves as an incident pulse of radiofrequency electromagnetic waves to a group of at least two groups of artificially structured sub-wavelength electromagnetic unit cells;
   the at least two groups of at least two artificially structured sub-wavelength electromagnetic unit cells,
   each group of the at least two groups configured to be respectively linearly arranged with respect to a z-axis of a bore of a magnetic resonant imaging or a nuclear magnetic resonant device,
   each group of the at least two groups of artificially structured sub-wavelength electromagnetic unit cells configured to transform the incident pulse of radiofrequency electromagnetic waves into a pulse of radiofrequency magnetic field $B_1$ orientated transverse to a segment of the z-axis (hereafter "transverse segment") and spatially proximate to the group.

2. A system comprising:
   a radiofrequency electromagnetic wave conducting structure configured to distribute a pulse of radiofrequency electromagnetic waves as an incident pulse of radiofrequency electromagnetic waves to a group of at least two selectable groups in response to a $B_1$ localization control signal;
   an array of the at least two selectable groups,
   each group of the at least two selectable groups including at least two artificially structured electromagnetic unit cells and configured to be respectively linearly arranged with respect to a z-axis of a bore of a magnetic resonant imaging or a nuclear magnetic resonant device, and
   each group of the at least two artificially structured electromagnetic unit cells respectively configured to transform the incident pulse of radiofrequency electromagnetic waves into a pulse of radiofrequency magnetic field $B_1$ orientated transverse to a segment of a z-axis (hereafter "transverse segment) and spatially proximate to the group; and
   a control circuit configured to generate the $B_1$ localization control signal defining a respective power distribution of a particular incident pulse of radiofrequency electromagnetic waves to each group of the at least two selectable groups, the respective power distribution collectively defining a particular pulse of radiofrequency magnetic field $B_1$ localized to a selected arbitrary examination segment transverse to the z-axis and within an examination region of the bore, the localized magnetic field $B_1$ having an intensity sufficient to excite a detectable magnetic resonance in magnetically active nuclei located within the selected arbitrary examination segment,
   wherein the localized pulse of the radiofrequency magnetic field $B_1$ produces a quasi-focused radiofrequency magnetic field $B_1$ localized to include the selected arbitrary examination segment.

3. A system comprising:
   a radiofrequency electromagnetic wave conducting structure configured to distribute a pulse of radiofrequency electromagnetic waves as an incident pulse of radiofrequency electromagnetic waves to a group of at least two selectable groups of artificially structured sub-wavelength electromagnetic unit cells in response to a $B_1$ localization control signal;
   an array of the at least two selectable groups of artificially structured sub-wavelength electromagnetic unit cells,
   each group of the at least two selectable groups including at least two artificially structured sub-wavelength electromagnetic unit cells and configured to be respectively linearly arranged with respect to a z-axis of a bore of a magnetic resonant imaging or a nuclear magnetic resonant device, each group of the at least two artificially structured sub-wavelength electromagnetic unit cells respectively configured to transform the incident pulse of radiofrequency electromagnetic waves into a pulse of radiofrequency magnetic field $B_1$ orientated transverse to a segment of a z-axis (hereafter "transverse segment) and spatially proximate to the group; and a control circuit configured to generate the $B_1$ localization control signal defining a respective power distribution of a particular incident pulse of radiofrequency electromagnetic waves to each group of the at least two selectable groups of artificially structured sub-wavelength electromagnetic unit cells, the respective power distribution collectively defining a particular pulse of radiofrequency magnetic field $B_1$ localized to a selected arbitrary examination segment transverse to the z-axis and within an examination region of the bore, the localized magnetic field $B_1$ having an intensity sufficient to excite a detectable magnetic resonance in magnetically active nuclei located within the selected arbitrary examination segment.

4. The system of claim 3, wherein each group of the at least two selectable groups is respectively individually accessible or controllable independent of their respective location or sequence in the array.

5. The system of claim 3, wherein the selected arbitrary examination segment includes within its z-axis boundaries a transverse slice of the examination region selected for examination.

6. The system of claim 3, further comprising:
a receiver configured to receive data indicative of a location along the z-axis of the transverse slice selected for examination.

7. The system of claim 3, wherein the localized pulse of the radiofrequency magnetic field $B_1$ includes a first radiofrequency electric field $E_1$ intensity in the selected arbitrary examination segment and includes a second radiofrequency electric field $E_2$ intensity in a second arbitrary transverse segment of the examination region, the second radiofrequency electric field intensity less than the first radiofrequency electric field intensity.

8. The system of claim 7, wherein the second radiofrequency electric field intensity is less than 66% of the first radiofrequency electric field intensity.

9. The system of claim 3, wherein the localized pulse of the radiofrequency magnetic field $B_1$ includes (i) a first radiofrequency electric field $E_1$ intensity in the selected arbitrary examination segment, (ii) a second radiofrequency electric field $E_2$ intensity in a second arbitrary transverse segment of the examination region abutting the selected arbitrary transverse segment, and (iii) a third radiofrequency electric field $E_3$ intensity in a third arbitrary transverse segment of the examination region abutting the selected arbitrary transverse segment and positioned opposite to the second arbitrary transverse segment, the second and third radiofrequency electric field intensities each less than the first radiofrequency electric field intensity.

10. The system of claim 3, wherein the localized pulse of the radiofrequency magnetic field $B_1$ is configured to produce a first specific absorption rate (SAR) in the selected arbitrary examination segment and to produce a second SAR in another arbitrary transverse segment of the examination region, the second SAR less than the first SAR.

11. The system of claim 10, wherein the second SAR is less than 66% of the first SAR.

12. The system of claim 3, wherein the respective power distribution further includes a respective power distribution collectively defining a particular pulse of radiofrequency magnetic field $B_1$ producing a minimized specific absorption rate (SAR) in the selected arbitrary examination segment.

13. The system of claim 12, wherein the defined particular pulse of radiofrequency magnetic field $B_1$ is configured in response to a model-based estimation of the localized pulse respective power distribution providing the minimized SAR.

14. The system of claim 12, wherein the respective power distribution is responsive to a contemporaneously-determined distribution of a radiofrequency magnetic field $B_1$ localized to the selected arbitrary examination segment with the minimized SAR.

15. The system of claim 14, wherein the contemporaneously-determined distribution is responsive to data contemporaneously received from at least one radiofrequency electric field sensor.

16. The system of claim 12, wherein the respective power distribution is selected responsive to an optimization technique.

17. The system of claim 3, wherein the respective power distribution further includes a respective power distribution collectively defining a particular pulse of radiofrequency magnetic field $B_1$ producing a selected ratio of a total specific absorption rate (SAR) produced in an examination subject divided by an average total SAR produced in the selected arbitrary examination segment of the examination subject.

18. The system of claim 17, wherein the selected ratio is selected responsive to an optimization technique.

19. The system of claim 3, wherein the radiofrequency magnetic field $B_1$ includes a pulse of tunable radiofrequency magnetic field $B_1$.

20. The system of claim 3, wherein the radiofrequency electromagnetic wave conducting structure is configured to receive the pulse of radiofrequency electromagnetic waves from a radiofrequency power amplifier component associated with the magnetic resonant imaging or the nuclear magnetic resonant device.

21. The system of claim 3, wherein the radiofrequency electromagnetic wave conducting structure includes an electronically controllable switch responsive to the $B_1$ localization control signal and coupled between a primary portion of the radiofrequency electromagnetic wave conducting structure and a secondary portion of the radiofrequency electromagnetic wave conducting structure, the secondary portion coupled to a group of the at least two groups.

22. The system of claim 3, wherein the respective power distribution defines a particular pulse of radiofrequency magnetic field $B_1$ localized to the selected arbitrary examination segment and having a substantially uniform magnetic field intensity.

23. The system of claim 22, wherein the substantially uniform magnetic field intensity includes less than an approximately five percent variation in the radiofrequency magnetic field $B_1$ intensity across the selected arbitrary examination segment.

24. The system of claim 22, wherein the substantially uniform magnetic field intensity includes a variation in the radiofrequency magnetic field $B_1$ intensity across the selected arbitrary examination segment by a factor of less than ten.

25. The system of claim 3, wherein the respective power distribution includes a model-based estimation of a respective power distribution providing a pulse of radiofrequency magnetic field $B_1$ localized to the selected arbitrary examination segment.

26. The system of claim 25, wherein the model-based estimation is responsive to a set of configurable rules.

27. The system of claim 25, wherein the model-based estimation of a respective power distribution is selected from a best available distribution scheme from at least two available distribution schemes.

28. The system of claim 25, wherein the model-based estimation of a respective power distribution is responsive to a contemporaneously-determined distribution of a radiofrequency magnetic field $B_1$ localized to the selected arbitrary examination segment.

29. The system of claim 28, wherein the model-based estimation of a respective power distribution is responsive to data contemporaneously received from at least one radiofrequency magnetic field sensor.

30. The system of claim 28, wherein the model-based estimation of a respective power distribution is responsive to a detected magnetic resonance in magnetically active nuclei located within at least a portion of the examination region.

31. The system of claim 3, wherein the respective power distribution defines an optimized pulse of the radiofrequency magnetic field $B_1$ localized to the selected arbitrary examination segment.

32. The system of claim 31, wherein the optimized pulse includes a pulse of radiofrequency magnetic field $B_1$ localized to the selected arbitrary examination segment and having a magnetic field intensity sufficient to excite a detectable magnetic resonance in magnetically active nuclei located within the selected arbitrary examination segment, subject to a constraint limiting the electric field intensity within the transverse segment to less than a preselected value.

33. The system of claim 3, wherein the artificially structured sub-wavelength electromagnetic unit cells of each group of the at least two groups include at least two electronically controllable, artificially structured sub-wavelength electromagnetic unit cells.

34. The system of claim 33, wherein the respective power distribution defined by the control signal further includes a gradient component of the radiofrequency magnetic field $B_1$ intensity orthogonal to the z-axis.

35. The system of claim 34, wherein the gradient component includes a gradient component in two respective directions orthogonal to the z-axis.

36. The system of claim 34, further comprising:
a unit cell controller configured to electronically control the at least two electronically controllable, artificially structured electromagnetic sub-wavelength unit cells of each group of the at least two selectable groups in response to the gradient component of the control signal.

37. The system of claim 3, wherein the at least two artificially structured sub-wavelength electromagnetic unit cells of each group of the at least two selectable groups include a single layer of at least two artificially structured sub-wavelength electromagnetic unit cells configured to generate a magnetic field component orthogonal to the z-axis.

38. The system of claim 3, wherein the at least two artificially structured electromagnetic sub-wavelength unit cells of each group of the at least two selectable groups include a first layer of at least two artificially structured sub-wavelength electromagnetic unit cells and a second layer of at least two artificially structured sub-wavelength electromagnetic unit cells, the artificially structured sub-wavelength electromagnetic unit cells of the first layer configured to generate a magnetic field component orthogonal to the z-axis, and the artificially structured sub-wavelength electromagnetic unit cells of the second layer configured to generate a magnetic field component orthogonal to the magnetic field component of the first layer of artificially structured sub-wavelength electromagnetic unit cells.

39. The system of claim 3, wherein the at least two artificially structured sub-wavelength electromagnetic unit cells of each group of the at least two selectable groups includes a first layer of at least two artificially structured sub-wavelength electromagnetic unit cells, a second layer of at least two artificially structured sub-wavelength electromagnetic unit cells, and a third layer of at least two artificially structured sub-wavelength electromagnetic unit cells, the three layers of artificially structured sub-wavelength electromagnetic unit cells in combination configured to generate magnetic field components in all three mutually orthogonal orientations.

40. The system of claim 3, wherein the at least two artificially structured sub-wavelength electromagnetic unit cells of each group of the at least two selectable groups include a single layer of the at least two artificially structured sub-wavelength electromagnetic unit cells that in combination generate a radiofrequency magnetic field $B_1$ in two orthogonal directions.

41. The system of claim 3, wherein the at least two artificially structured sub-wavelength electromagnetic unit cells of each group of the at least two selectable groups include a single layer of the at least two artificially structured sub-wavelength electromagnetic unit cells that in combination generate a radiofrequency magnetic field $B_1$ in all three mutually orthogonal orientations.

42. The system of claim 3, further comprising the magnetic resonant imaging or the nuclear magnetic resonant device.

43. A method comprising:
receiving a pulse of radiofrequency electromagnetic waves from a radiofrequency signal generator or signal synthesizer component of a magnetic resonant imaging or a nuclear magnetic resonant device;
generating a $B_1$ localization control signal defining a respective power distribution of the pulse of radiofrequency electromagnetic waves to each group of at least two selectable groups of at least two artificially structured sub-wavelength electromagnetic unit cells, each group of the at least two selectable groups configured to be respectively linearly arranged with respect to a z-axis of a bore of the magnetic resonant imaging or the nuclear magnetic resonant device,
the respective power distribution collectively defining a pulse of radiofrequency magnetic field $B_1$ localized to a selected arbitrary examination segment transverse to the z-axis and within an examination region of the bore,
distributing the received pulse of radiofrequency electromagnetic waves as an incident pulse of radiofrequency electromagnetic waves to a group of the at least two selectable groups in accord with the $B_1$ localization control signal; and
transforming, using the at least two artificially structured sub-wavelength electromagnetic unit cells of the group, the incident pulse of radiofrequency electromagnetic waves into a localized pulse of a radiofrequency magnetic field $B_1$ orientated transverse to the selected arbitrary examination segment and having an intensity sufficient to excite a detectable magnetic resonance in magnetically active nuclei located within the selected arbitrary examination segment.

44. The method of claim 43, further comprising:

selecting the arbitrary examination segment responsive to data indicative of a location of a slice along the z-axis a transverse selected for examination.

* * * * *